(12) United States Patent
Kim et al.

(10) Patent No.: US 9,659,641 B2
(45) Date of Patent: May 23, 2017

(54) ON-CHIP RESISTANCE MEASUREMENT CIRCUIT AND RESISTIVE MEMORY DEVICE INCLUDING THE SAME

(71) Applicant: Samsung Electronics Co., Ltd., Suwon-si (KR)

(72) Inventors: Chan-Kyung Kim, Hwaseong-si (KR); Kee-Won Kwon, Seongnam-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 101 days.

(21) Appl. No.: 14/660,530

(22) Filed: Mar. 17, 2015

(65) Prior Publication Data

US 2015/0364187 A1  Dec. 17, 2015

(30) Foreign Application Priority Data

Jun. 17, 2014 (KR) ................ 10-2014-0073453

(51) Int. Cl.
*G11C 13/00* (2006.01)
*G11C 11/16* (2006.01)
*G11C 11/56* (2006.01)

(52) U.S. Cl.
CPC ........ *G11C 13/004* (2013.01); *G11C 11/1673* (2013.01); *G11C 11/5607* (2013.01); *G11C 11/5678* (2013.01); *G11C 11/5685* (2013.01); *G11C 2013/0054* (2013.01)

(58) Field of Classification Search
CPC .......................... G11C 13/004; G11C 13/0069
See application file for complete search history.

(56) References Cited

U.S. PATENT DOCUMENTS

| | | | |
|---|---|---|---|
| 6,314,020 B1 | 11/2001 | Hansen et al. | |
| 7,292,466 B2 | 11/2007 | Nirschl | |
| 7,495,971 B2 | 2/2009 | Egerer | |
| 7,881,119 B2 | 2/2011 | Fukushima | |
| 7,929,334 B2 | 4/2011 | Rao et al. | |
| 2012/0140574 A1* | 6/2012 | Lee ........................ | G11C 7/065 365/189.06 |
| 2012/0313801 A1 | 12/2012 | Maejima et al. | |
| 2013/0148406 A1* | 6/2013 | Shimakawa ........ | G11C 11/1673 365/148 |
| 2013/0314982 A1 | 11/2013 | Zhou et al. | |
| 2013/0329488 A1 | 12/2013 | Abedifard et al. | |
| 2014/0010023 A1 | 1/2014 | Park et al. | |
| 2015/0076485 A1* | 3/2015 | Sandhu ................. | G11C 11/161 257/43 |
| 2015/0187416 A1* | 7/2015 | Bedeschi ............. | G11C 13/004 711/154 |

FOREIGN PATENT DOCUMENTS

| | | |
|---|---|---|
| JP | 2003-085966 A | 3/2003 |
| JP | 2003-085968 A | 3/2003 |

* cited by examiner

*Primary Examiner* — Tri Hoang
(74) *Attorney, Agent, or Firm* — Muir Patent Law, PLLC

(57) ABSTRACT

A resistive memory device may include a resistive cell array and an on-chip resistance measurement circuit. The resistive cell array may include a plurality of resistive memory cells. The on-chip resistance measurement circuit may be configured to generate a first current and a second current greater or less than the first current based on a cell current corresponding to a cell resistance of a first memory cell of the resistive memory cells, and to generate first and second digital signals based on the first and second current, respectively.

20 Claims, 25 Drawing Sheets

FIG. 12

|       | TC   | BC  | DV |
|-------|------|-----|----|
| CASE1 | 0000 | 000 | 0  |
| CASE2 | 0001 | 001 | 1  |
| CASE3 | 0011 | 010 | 2  |
| CASE4 | 0111 | 011 | 3  |
| CASE5 | 1111 | 100 | 4  |

ON-CHIP RESISTANCE MEASUREMENT CIRCUIT AND RESISTIVE MEMORY DEVICE INCLUDING THE SAME

CROSS-REFERENCE TO RELATED APPLICATION

This U.S. Non-provisional application claims priority under 35 USC §119 to Korean Patent Application No. 10-2014-0073453 filed on Jun. 17, 2014, in the Korean Intellectual Property Office (KIPO), the disclosure of which is incorporated by reference in its entirety herein.

BACKGROUND

1. Technical Field

The present disclosure relates generally to semiconductor integrated circuits, and more particularly to an on-chip resistance measurement circuit and a resistive memory device including the on-chip resistance measurement circuit for measuring resistance distribution of resistive memory cells.

2. Discussion of the Related Art

Due to demand for high memory capacity, high operation speed and low power consumption of memory devices, resistive memory devices of various types have been developed in an attempt to combine the high integration rate and high speed of DRAM devices and the non-volatility of flash memory devices in a single memory device. Materials used in resistive memory devices have a resistance that is variable depending on magnitude and/or direction of applied voltage and/or current. Moreover, the resistance of the material can be maintained (that is, non-volatility) even though the applied voltage and/or current is removed and thus a refresh operation may not be required.

Memory cells in a resistive memory device have a resistance distribution depending on operation conditions such as a voltage, a temperature, variations of manufacturing process, etc. and the performance of the resistive memory device may depend on the characteristics of the resistance distribution. Exact and rapid measurement of the resistance distribution is typically used to verify and test the performance of the resistive memory device.

SUMMARY

Some example embodiments of the present disclosure provide an on-chip resistance measurement circuit capable of efficiently measuring resistance distribution of a resistive memory device.

Some example embodiments of the present disclosure provide a resistive memory device including an on-chip resistance measurement circuit capable of efficiently measuring resistance distribution of a resistive memory device.

According to example embodiments, a resistive memory device includes a resistive cell array and an on-chip resistance measurement circuit. The resistive cell array includes a plurality of resistive memory cells. The on-chip resistance measurement circuit is configured to generate a first current and a second current greater or less than the first current based on a cell current corresponding to a cell resistance of a selected memory cell of the resistive memory cells, and to generate first and second digital signals based on the first and second currents, respectively.

The on-chip resistance measurement circuit may include a current-to-voltage converter, a first analog-to-digital converter, and a second analog-to-digital converter. The current-to-voltage converter may be configured to convert the cell current to a cell bias voltage. The first analog-to-digital converter may be configured to generate the first digital signal based on the first current. The second analog-to-digital converter may be configured to generate the second digital signal based on the second current.

The current-to-voltage converter and the first and second analog-to-digital converters may be configured to form a current mirror such that the cell bias voltage is provided to the first and second analog-to-digital converters.

Each of the first and second analog-to-digital converters may include a p-type metal oxide semiconductor (PMOS) transistor diode-coupled between a power supply voltage line and a first node, an n-type metal oxide semiconductor (NMOS) transistor coupled between the first node and a ground voltage line, a gate of the NMOS transistor receiving the cell bias voltage and an inverter configured to generate a respective digital signal based on a voltage on the first node.

At least one of the PMOS transistor and the NOS transistor may have a size increasing or decreasing gradually with respect to the first and second analog-to-digital converters.

Each of the first and second analog-to-digital converters may include a PMOS transistor coupled between a power supply voltage line and a first node, a gate of the PMOS transistor receiving the cell bias voltage, an NMOS transistor diode-coupled between the first node and a ground voltage line and an inverter configured to generate a respective digital signal based on a voltage on the first node.

Each of the first and second analog-to-digital converters may be configured to generate a respective operation current based on a reference bias voltage and the cell bias voltage, and to generate a respective digital signal of the temperature code based on the respective operation current.

Each of the first and second analog-to-digital converters may include a PMOS transistor coupled between a power supply voltage line and a first node, a gate of the PMOS transistor configured to receive the reference bias voltage, n NMOS transistor diode-coupled between the first node and a ground voltage line, a gate of the NMOS transistor configured to receive the cell bias voltage and an inverter configured to generate a respective digital signal based on a voltage on the first node.

Each of the first and second analog-to-digital converters may include a PMOS transistor coupled between a power supply voltage line and a first node, a gate of the PMOS transistor configured to receive the cell bias voltage, an NMOS transistor diode-coupled between the first node and a ground voltage line, a gate of the NMOS transistor configured to receive the reference bias voltage and an inverter configured to generate a respective digital signal based on a voltage on the first node.

The on-chip resistance measurement circuit may further include a reference bias circuit configured to generate a reference bias voltage. The first and second analog-to-digital converters analog-to-digital converters may be configured to generate the first and second currents based on the reference bias voltage and the cell bias voltage, and to generate the first and second digital signals of the temperature code based on the first and second currents, respectively.

A transistor of a first type in the current-to-voltage converter and a transistor of the first type in each of the first and second analog-to-digital converters are configured to may form a current mirror such that the cell bias voltage is provided to the first and second analog-to-digital converters. A transistor of a second type in the reference bias circuit and a transistor of the second type in each of the first and second analog-to-digital converters are configured to may form a current mirror such that the reference bias voltage is provided to the first and second analog-to-digital converters.

The reference bias circuit may include a current source configured to generate a reference current, a current mirror configured to generate a mirror current based on the reference current and a reference current-to-voltage converter configured to convert the mirror current to the reference bias voltage.

The current source may be a variable current source configured to vary the reference current based on an external control signal.

The resistive memory device may include a code conversion circuit. The code conversion circuit may be configured to convert the temperature code to bit signals of a binary code.

The on-chip resistance measurement circuit may be coupled between a column selection circuit and a read-write circuit, where the column selection circuit is configured to selectively connect the read-write circuit and a bitline coupled to the selected memory cell.

According to example embodiments, a resistive memory device includes a resistive cell array and a plurality of on-chip resistance measurement circuits. The resistive cell array includes a plurality of resistive memory cells. Each of the on-chip resistance measurement circuits is configured to convert a cell current corresponding to a cell resistance of a respective memory cell of the resistive memory cells to a cell bias voltage, to generate a first current and a second current greater or less than the first current, and to generate a first digital signal and a second digital signal based on the first and second currents, respectively.

The resistive memory device may further include a shift register configured to serialize the digital signals and output the serialized digital signals.

A number of the on-chip resistance measurement circuits may be equal to a number of bitlines that are selected simultaneously in response to a column address.

According to example embodiments, an on-chip resistance measurement circuit includes a current-to-voltage converter and an analog-to-digital converter. The current-to-voltage converter is configured to convert a cell current to a cell bias voltage, where the cell current corresponds to a cell resistance of a selected memory cell of a plurality of resistive memory cells. The analog-to-digital converter includes n conversion circuits, n is a natural number equal to or greater than 2. The n conversion circuits are configured to, in response to the cell bias voltage, generate n respective operation currents different from each other and to generate n digital signals based on the n respective operation currents.

The on-chip resistance measurement circuit and the resistive memory device according to example embodiments are disposed in the same semiconductor die as the resistive memory and thus may measure the cell resistances efficiently and rapidly without degrading integration degree of the resistive memory device.

Further the on-chip resistance measurement circuit and the resistive memory device according to example embodiments may measure the cell resistances exactly by accessing the resistive memory cells directly.

BRIEF DESCRIPTION OF THE DRAWINGS

Example embodiments of the inventive concept will be more clearly understood from the following detailed description taken in conjunction with the accompanying drawings.

FIG. 12 is an exemplary diagram for describing relations between a temperature code and a binary code.

DETAILED DESCRIPTION OF THE EMBODIMENTS

Figure 1:
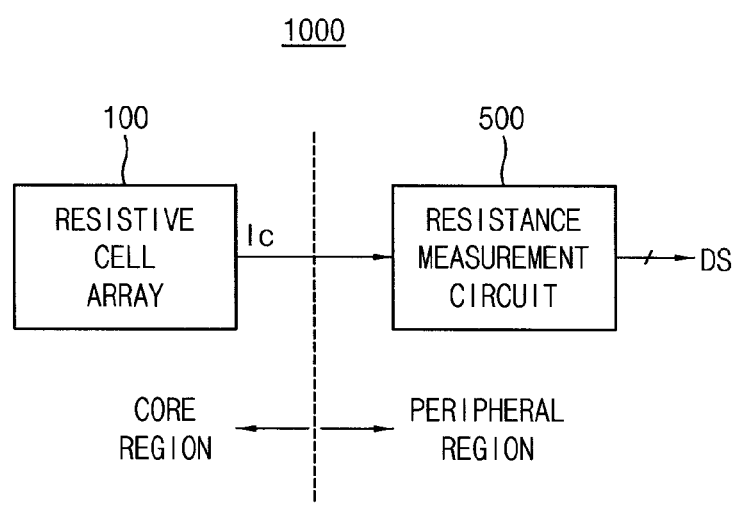
FIG. 1 is a block diagram illustrating a resistive memory device according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless indicated otherwise, these terms are only used to distinguish one element from another. For example, a first element discussed below could be termed a second element without departing from the teachings of the present inventive concept. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as contacting another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a resistive memory device according to example embodiments.

Referring to FIG. 1, a resistive memory device 1000 includes a resistive cell array 100 and an on-chip resistance measurement circuit 500.

As used herein, a semiconductor device may refer to various items such as a memory device, one or more logic devices or memory cells formed in or on a semiconductor substrate, a semiconductor chip, a memory chip, a logic chip, a package, or combinations thereof. A semiconductor device such as a semiconductor chip, a memory chip, or a logic chip may be formed from a wafer. A semiconductor device may include one or more chips stacked on a package substrate, or a package-on-package device including a plurality of packages. A semiconductor device may include an array of memory cells.

An electronic device, as used herein, may refer to one of these devices and may also include products that include these devices, such as a memory module, a hard drive including additional components, a mobile phone, laptop, tablet, desktop, camera, server, computing system, or other consumer electronic device, etc. As used herein, an on-chip resistance measurement circuit may be included in at least one of these devices.

The resistive cell array 100 is integrated in, or disposed in, a first region (e.g., a core region) of a semiconductor die (e.g., a semiconductor chip), and the resistive memory cell array 100 includes a plurality of resistive memory cells. This region may also be referred to as a cell region. The configuration of the resistive cell array and the resistive memory cells are further described with reference to FIGS. 16 through 20H. The semiconductor die may be a portion from a wafer.

The on-chip resistance measurement circuit 500 is disposed in a second region (e.g., a peripheral region) of the semiconductor die, and the on-chip resistance measurement circuit 500 receives a cell current Ic corresponding to a cell resistance of a selected memory cell (e.g., a first memory cell) among the resistive memory cells. The on-chip resistance measurement circuit 500 generates a digital signal DS representing the cell resistance based on the cell current. The digital signal DS may include a plurality of bit signals of a temperature code or a binary code as will be described below. For example, the digital signal DS may include a voltage level having a logic level selected from among a logic level "0" and a logic level "1."

Figure 2A:
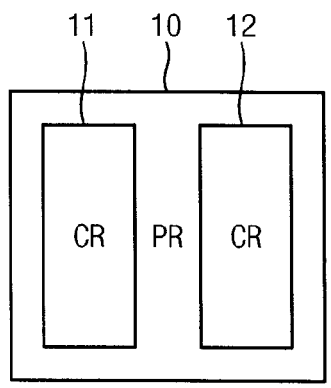
FIGS. 2A and 2B are diagrams illustrating example layouts of a resistive memory device according to example embodiments.
Figure 2B:
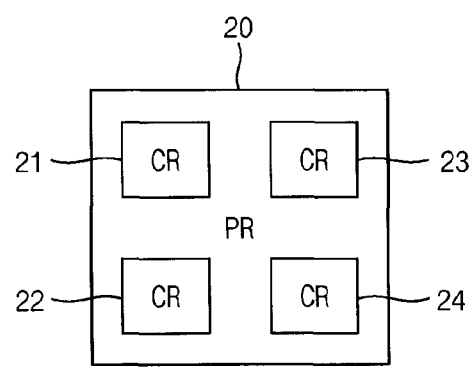

FIGS. 2A and 2B are diagrams illustrating example layouts of a resistive memory device according to example embodiments.

Referring to FIGS. 2A and 2B, each of semiconductor dies (e.g., semiconductor chips) 10 and 20 may be partitioned into a core region CR and a peripheral region PR.

In one embodiment, a memory cell array, a write driver, a sense amplifier, etc. may be disposed in the core region CR of the semiconductor dies 10 and 20. FIG. 2A illustrates the semiconductor die 10 where the core region CR includes two sub regions 11 and 12 and FIG. 2B illustrates the semiconductor die 20 where the core region CR includes four sub regions 21, 22, 23 and 24. Memory cell arrays may be formed in the sub regions 11, 12, 21, 22, 23 and 24, respectively, and the memory cell arrays may communicate with external devices independently through a plurality of independent channels. The number and the layout of the sub regions forming the core region may be implemented variously.

In one embodiment, peripheral circuits such as control logics, input-output circuits, etc. may be disposed in the peripheral region PR of the semiconductor dies 10 and 20. The on-chip resistance measurement circuit 500 according to example embodiments is disposed in the peripheral region PR. The on-chip resistance measurement circuit 500 may measure the cell resistances of the resistive memory cells efficiently and rapidly without degrading integration degree of the resistive memory device because it is disposed in the same semiconductor die as the resistive memory cells.

In a conventional scheme, dummy cells are disposed together with the resistive memory cells and the resistance distribution of the resistive memory cells is measured indirectly using the dummy cells. The resistance distribution of the dummy cells may not represent the resistance distribution of the resistive memory cells and such indirect measurement may not provide the exact values. In another conventional scheme, voltage or current representing the cell resistance is output to a device external to the resistive memory device to measure the cell resistance. In this case, exactness of the measured cell resistance is degraded because the voltage or current representing the cell resistance is a very small analog value and the analog value may be distorted through a long transfer path. The on-chip resistance measurement circuit 500 according to example embodiments may measure the cell resistances exactly by accessing the resistive memory cells directly.

Figure 3:
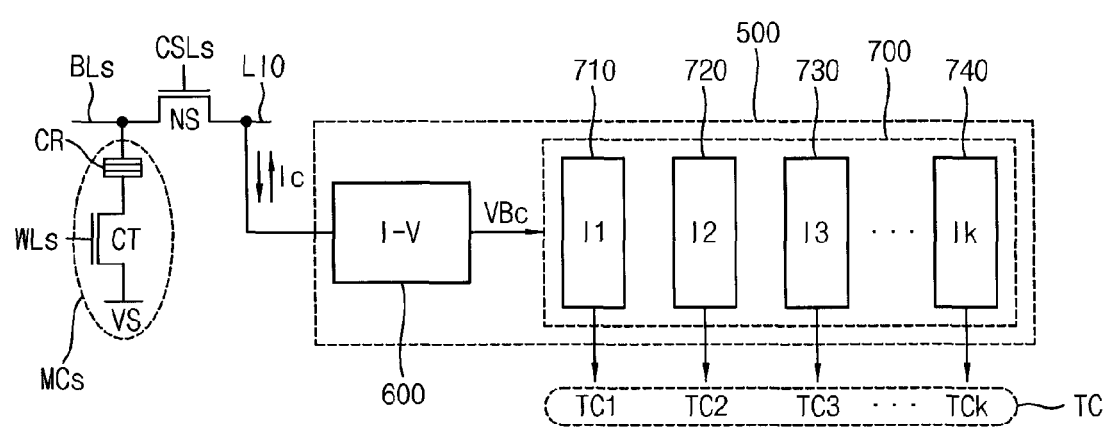
FIG. 3 is a block diagram illustrating an on-chip resistance measurement circuit according to example embodiments.

FIG. 3 is a block diagram illustrating an on-chip resistance measurement circuit according to example embodiments.

One selected resistive memory cell MCs and a transfer path of a cell current Ic are illustrated in FIG. 3 together with an on-chip resistance measurement circuit 500. Each resistive memory cell may include a cell transistor CT and a resistive element CR, which are coupled serially between a corresponding bitline and a source voltage VS. A wordline WLs is selected based on a row address and a bitline BLs is selected based on a column address and thus the resistive memory cell MCs is selected, which is located in a cross point of the selected wordline WLs and the selected bitline BLs. A column selection line CSLs corresponding to the selected bitline BLs is activated and a column selection transistor NS is turned on to electrically connect the selected bitline BLs to a local input-output line LIO.

As such, the cell current Ic through the selected resistive memory cell MCs may be provided to the on-chip resistance measurement circuit 500 that is connected to the local input-output line LIO. The direction of the cell current Ic may be determined by controlling the source voltage VS. The cell current Ic may flow from the on-chip resistance measurement circuit 500 to the source voltage VS through the selected resistive memory cell MCs or from the source voltage VS to the on-chip resistance measurement circuit 500 through the selected resistive memory cell MCs. The cell resistance of the resistive memory cell MCs is changed depending on the state of the resistive element CR. The resistance Rc of the resistive element CR is considered as the cell resistance of the resistive memory cell MCs if neglecting the resistance of the cell transistor CT and the transfer path. The cell resistance Rc may be measured by the cell current Ic.

Referring to FIG. 3, the on-chip resistance measurement circuit 500 may generate operation currents I1 through Ik different from each other internally and may generate bit signals TC1 through TCk of a temperature code TC representing the cell resistance Rc based on the operation currents I1 through Ik. For example, each of the bit signals TC1 through TCk includes a voltage level having a logic level "0" or a logic level "1."

The on-chip resistance measurement circuit 500 may include a current-to-voltage converter (I-V) 600 and an analog-to-digital converter 700. The current-to-voltage converter 600 may convert the cell current Ic to a cell bias voltage VBc. The analog-to-digital converter 700 may include a plurality of conversion circuits 710, 720, 730 and 740. Each of the conversion circuits 710, 720, 730 and 740 receives the cell bias voltage VBc to generate each of the operation currents I1 through Ik and generate each of the bit signals TC1 through TCk based on each of the operation currents I1 through Ik.

As will be described below, the different operation currents I1 through Ik may be generated using a plurality of transistors having sizes different from each other. The operation currents I1 through Ik may be increased or decreased gradually with respect to the conversion circuits 710, 720, 730 and 740. In an example embodiment, the internal resistances of the conversion circuits 710, 720, 730 and 740 may be decreased gradually and the operation currents I1 through Ik may be increased gradually such that the operation current I1 of the first conversion circuit 710 is smallest and the operation current Ik of the last conversation circuit 740 is greatest. In another example embodiment, the internal resistances of the conversion circuits 710, 720, 730 and 740 may be increased gradually and the operation currents I1 through Ik may be decreased gradually such that the operation current I1 of the first conversion circuit 710 is greatest and the operation current Ik of the last conversation circuit 740 is smallest.

As will be described below, a transistor in the current-to-voltage converter 600 and a transistor in each of the conversion circuits 710, 720, 730 and 740 form a current mirror to provide the cell bias voltage VBc from the current-to-voltage converter 600 to each of the conversion circuits 710, 720, 730 and 740.

Figure 4:
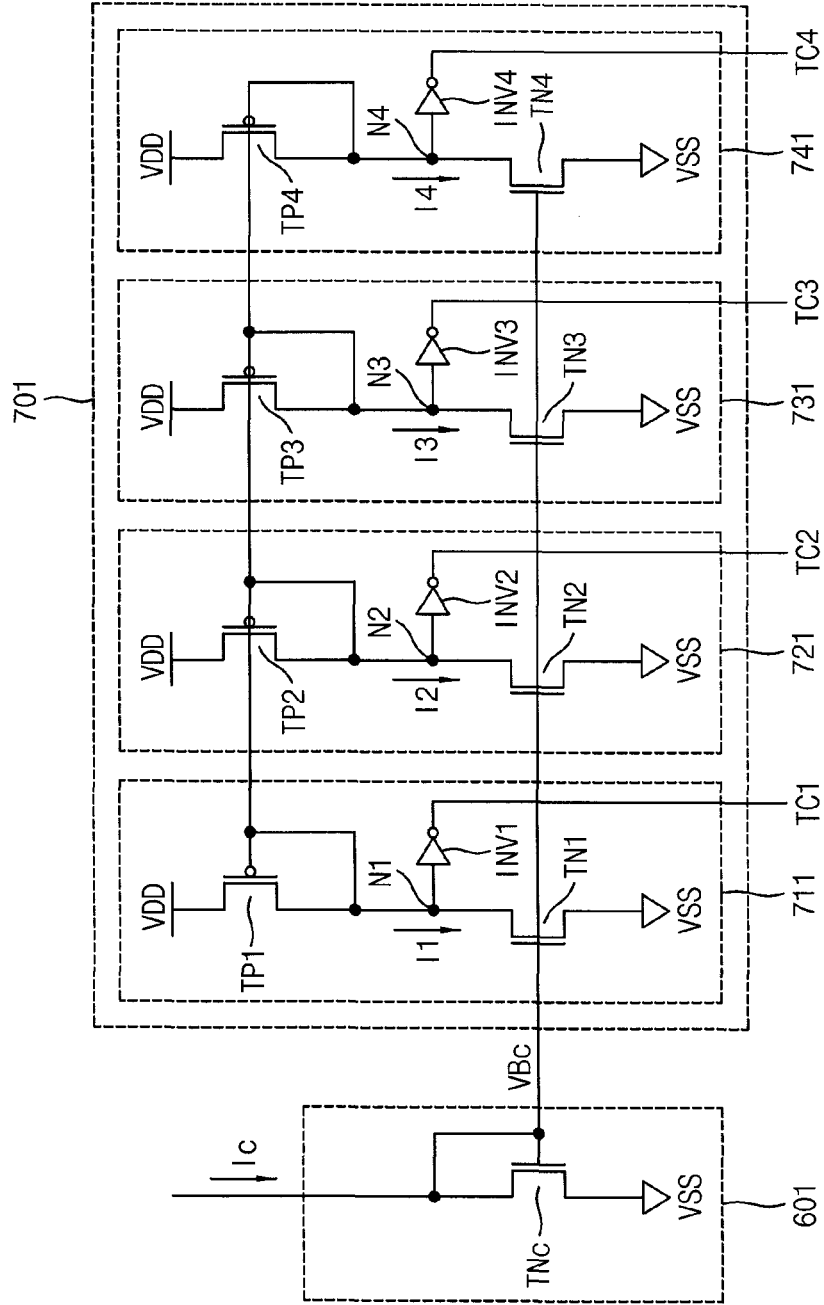
FIG. 4 is a circuit diagram illustrating an example embodiment of the on-chip resistance measurement circuit of FIG. 3.

FIG. 4 is a circuit diagram illustrating an example embodiment of the on-chip resistance measurement circuit of FIG. 3.

Referring to FIG. 4, an on-chip resistance measurement circuit 501 may include a current-to-voltage converter 601 and an analog-to-digital converter 701. The analog-to-digital converter 701 may include a plurality of conversion circuits 711, 721, 731 and 741. FIG. 4 illustrates a non-limiting example of four conversion circuits and the number of the conversion circuits may be determined variously depending on range and resolution of resistance distribution to be measured.

The current-to-voltage converter 601 may include an n-type metal oxide semiconductor (NMOS) transistor TNc that receives the cell current Ic and is diode-coupled to a ground voltage VSS (e.g., a ground voltage VSS line) to provide the cell bias voltage VBc. In one embodiment, each of the conversion circuits 711, 721, 731 and 741 may include a p-type metal oxide semiconductor (PMOS) transistor TPi (i=1, 2, 3, 4), an NMOS transistor TNi and an inverter INVi. The PMOS transistor TPi is diode-coupled between a power supply voltage VDD (e.g., a power supply voltage VDD line) and a sampling node (e.g., a first node) Ni. The NMOS transistor TNi is coupled between the sampling node Ni and the ground voltage VSS, and a gate of the NMOS transistor TNi receives the cell bias voltage VBc. The inverter INVi generates each bit signal TCi based on a voltage on the sampling node Ni.

In one embodiment, the PMOS transistor TPi may have a size increasing or decreasing gradually with respect to the conversion circuits 711, 721, 731 and 741. For example, the sizes of the PMOS transistors TP1, TP2, TP3 and TP4 may be increased gradually when the operation currents I1, I2, I3 and I4 are increased gradually such that the operation current I1 of the first conversion circuit 711 is smallest and the operation current I4 of the last conversation circuit 741 is greatest. In another example embodiment, the sizes of the PMOS transistors TP1, TP2, TP3 and TP4 may be deceased gradually when the operation currents I1, I2, I3 and I4 are decreased gradually such that the operation current I1 of the first conversion circuit 711 is greatest and the operation current I4 of the last conversation unit 741 is smallest. In certain embodiments, each of the sizes of the NMOS transistors TN1, TN2, TN3 and TN4 may have a predetermined size.

As illustrated in FIG. 4, the NMOS transistor TNc in the current-to-voltage converter 601 and the NMOS transistor TNi in each of the conversion circuits 711, 721, 731 and 741 may form a current mirror to provide the cell bias voltage VBc from the current-to-voltage converter 601 to each of the conversion circuits 711, 721, 731 and 741.

Figure 5:
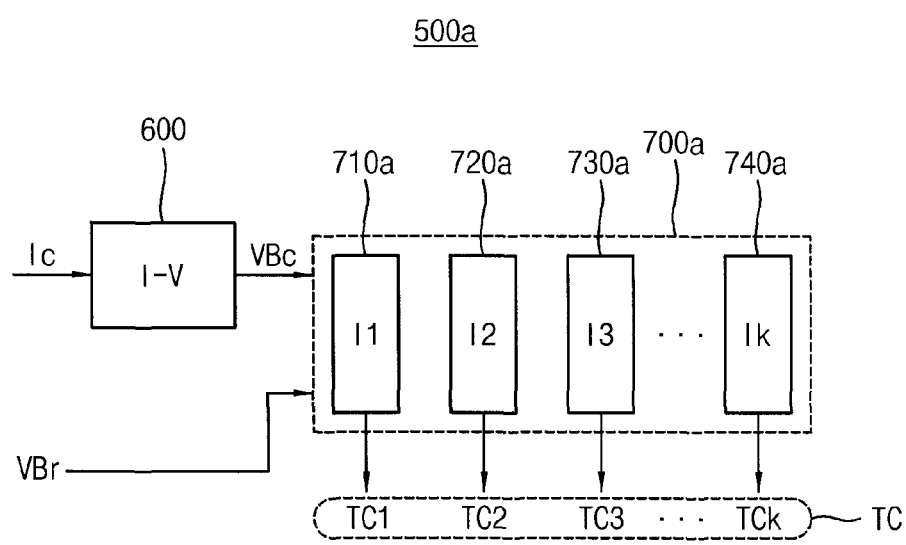
FIG. 5 is a block diagram illustrating an on-chip resistance measurement circuit according to example embodiments.

FIG. 5 is a block diagram illustrating an on-chip resistance measurement circuit according to example embodiments.

Referring to FIG. 5, an on-chip resistance measurement circuit 500a may generate operation currents I1 through Ik different from each other internally and may generate bit signals TC1 through TCk of a temperature code TC representing the cell resistance Rc based on the operation currents I1 through Ik.

The on-chip resistance measurement circuit 500a may include a current-to-voltage converter (I-V) 600 and an analog-to-digital converter 700a. The current-to-voltage converter 600 may convert the cell current Ic to a cell bias voltage VBc. The analog-to-digital converter 700a may include a plurality of conversion circuits 710a, 720a, 730a and 740a. Each of the conversion circuits 710a, 720a, 730a and 740a may receive a reference bias voltage VBr and the cell bias voltage VBc to generate each of the operation currents I1 through Ik and generate each of the bit signals TC1 through TCk based on each of the operation currents I1 through Ik.

In an example embodiment, the reference bias voltage VBr may be provided from an external as a voltage signal having a voltage level that is determined through test processes. In another example embodiment, the reference bias voltage VBr may be generated in the on-chip resistance measurement circuit as described with reference to FIGS. 7, 8 and 15. In one embodiment, the reference bias voltage VBr may be generated from a certain circuit disposed in the peripheral region PR.

Figure 6:
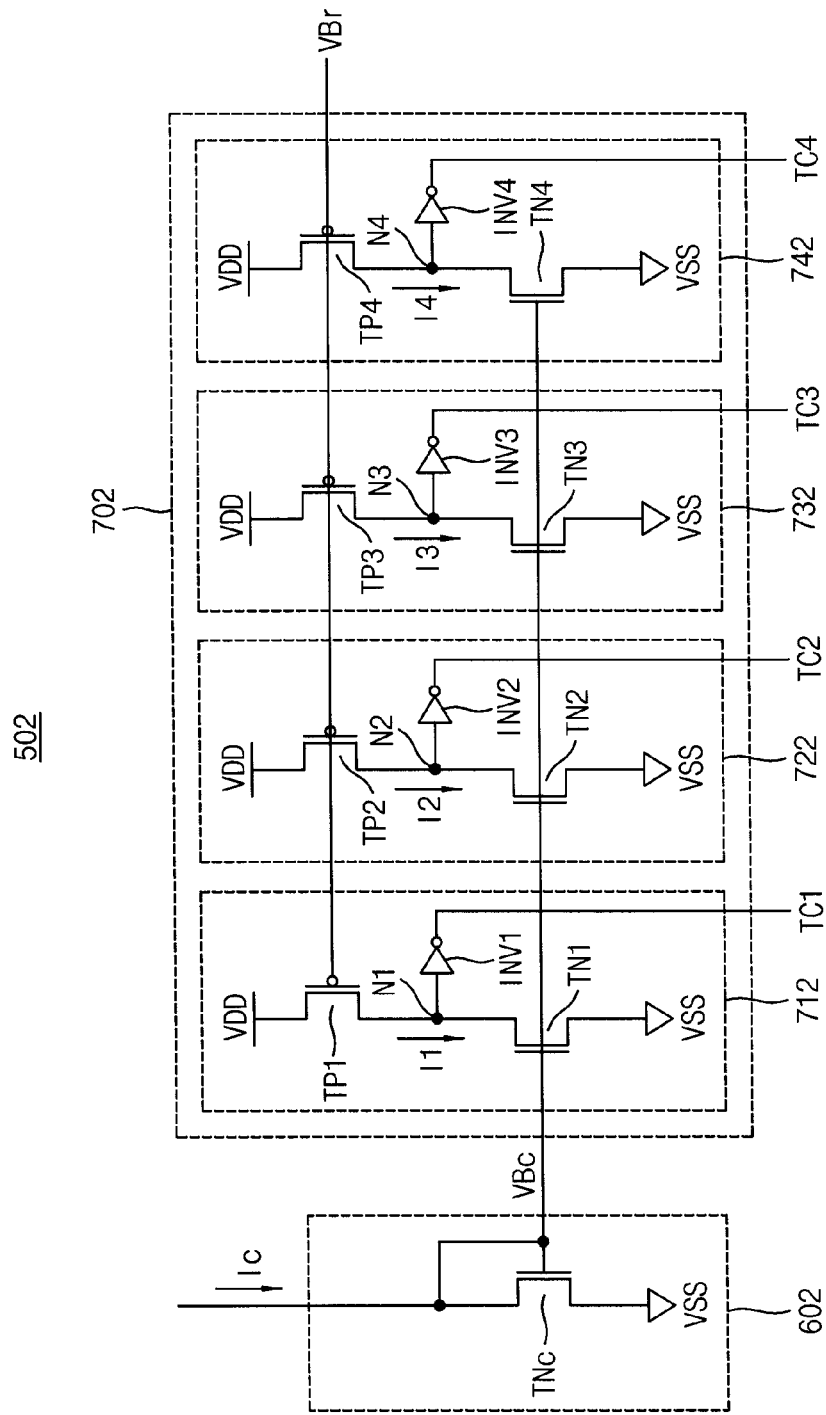
FIG. 6 is a circuit diagram illustrating an example embodiment of the on-chip resistance measurement circuit of FIG. 5.

FIG. 6 is a circuit diagram illustrating an example embodiment of the on-chip resistance measurement circuit of FIG. 5.

Referring to FIG. 6, an on-chip resistance measurement circuit 502 may include a current-to-voltage converter 602 and an analog-to-digital converter 702. The analog-to-digital converter 702 may include a plurality of conversion circuits 712, 722, 732 and 742. FIG. 6 illustrates a non-limiting example of four conversion circuits and the number of the conversion circuits may be determined variously depending on range and resolution of resistance distribution to be measured.

The current-to-voltage converter 602 may include an NMOS transistor TNc that receives the cell current Ic and is diode-coupled to a ground voltage VSS (e.g., a ground voltage VSS line) to provide the cell bias voltage VBc. In one embodiment, each of the conversion circuits 712, 722, 732 and 742 may include a PMOS transistor TPi (i=1, 2, 3, 4), an NMOS transistor TNi and an inverter INVi. The PMOS transistor TPi is coupled between a power supply voltage VDD (e.g., a power supply voltage VDD line) and a sampling node (e.g., a first node) Ni, and a gate of the PMOS transistor TPi receives the reference bias voltage VBr. The NMOS transistor TNi is coupled between the sampling node Ni and the ground voltage VSS, and a gate of the NMOS transistor TNi receives the cell bias voltage VBc. The inverter INVi generates each bit signal TCi based on a voltage on the sampling node Ni.

In one embodiment, the PMOS transistor TPi may have a size increasing or decreasing gradually with respect to the conversion circuits 712, 722, 732 and 742. For example, the sizes of the PMOS transistors TP1, TP2, TP3 and TP4 may be increased gradually. In this case, the operation currents I1, I2, I3 and I4 may be increased gradually such that the operation current I1 of the first conversion circuit 712 is smallest and the operation current I4 of the last conversation circuit 742 is greatest. In another example embodiment, the sizes of the PMOS transistors TP1, TP2, TP3 and TP4 may be decreased gradually. In this case, the operation currents I1, I2, I3 and I4 may be decreased gradually such that the operation current I1 of the first conversion circuit 712 is greatest and the operation current I4 of the last conversation unit 742 is smallest. In certain embodiments, each of the sizes of the NMOS transistors TN1, TN2, TN3 and TN4 may have a predetermined size.

As illustrated in FIG. 6, the NMOS transistor TNc in the current-to-voltage converter 602 and the NMOS transistor TNi in each of the conversion circuits 712, 722, 732 and 742 may form a current mirror to provide the cell bias voltage VBc from the current-to-voltage converter 602 to each of the conversion circuits 712, 722, 732 and 742.

Figure 7:
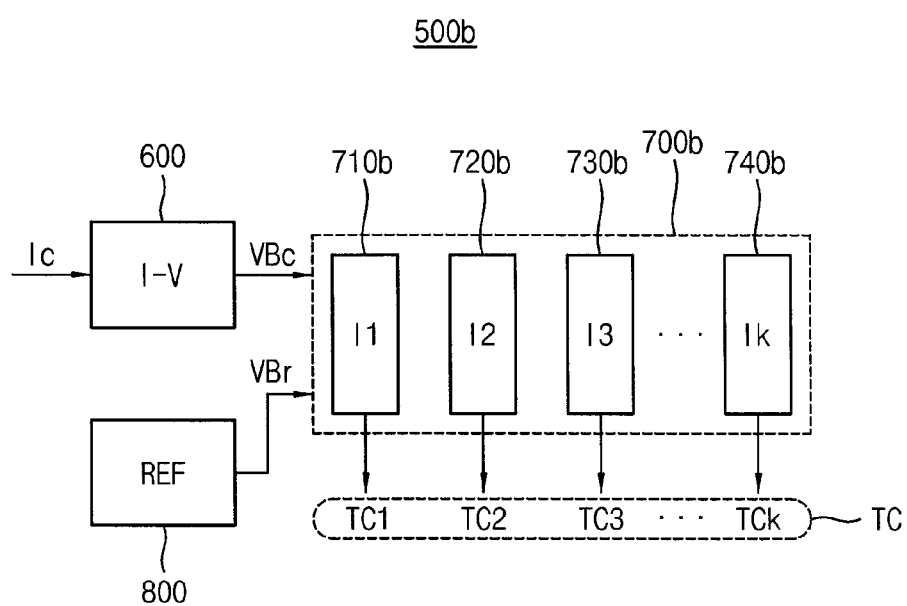
FIG. 7 is a block diagram illustrating an on-chip resistance measurement circuit according to example embodiments.

FIG. 7 is a block diagram illustrating an on-chip resistance measurement circuit according to example embodiments.

Referring to FIG. 7, an on-chip resistance measurement circuit 500b may generate operation currents I1 through Ik different from each other internally and may generate bit signals TC1 through TCk of a temperature code TC representing the cell resistance Rc based on the operation currents I1 through Ik.

The on-chip resistance measurement circuit 500b may include a current-to-voltage converter (I-V) 600, an analog-to-digital converter 700b and a reference bias circuit (REF) 800. The current-to-voltage converter 600 may convert the cell current Ic to a cell bias voltage VBc. The reference bias circuit 800 may generate a reference bias voltage VBr internally. The analog-to-digital converter 700b may include a plurality of conversion circuits 710b, 720b, 730b and 740b. Each of the conversion circuits 710b, 720b, 730b and 740b may receive the reference bias voltage VBr and the cell bias voltage VBc to generate each of the operation currents I1 through Ik and generate each of the bit signals TC1 through TCk based on each of the operation currents I1 through Ik.

Figure 8:
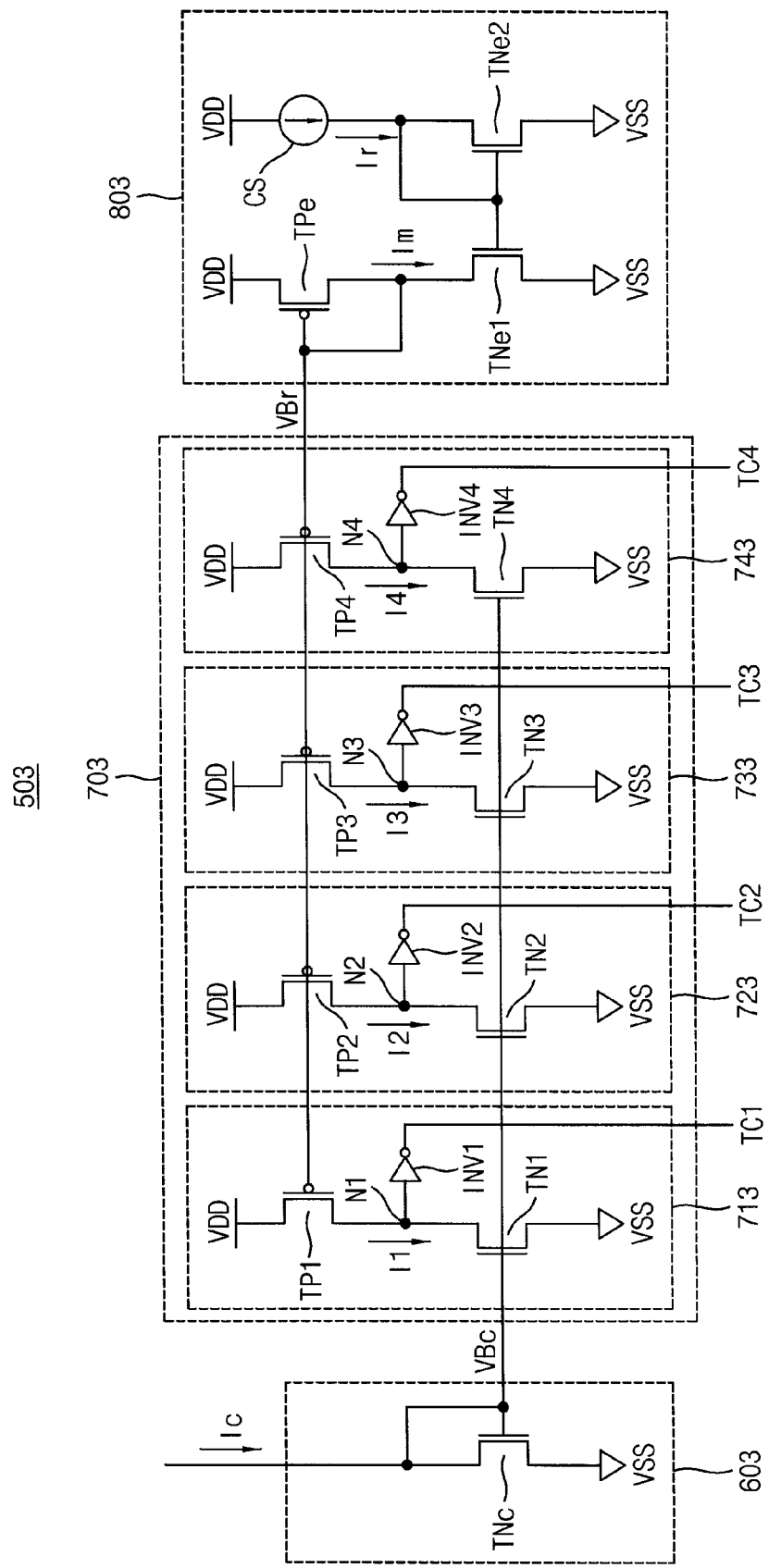
FIG. 8 is a circuit diagram illustrating an example embodiment of the on-chip resistance measurement circuit of FIG. 7.

FIG. 8 is a circuit diagram illustrating an example embodiment of the on-chip resistance measurement circuit of FIG. 7.

Referring to FIG. 8, an on-chip resistance measurement circuit 503 may include a current-to-voltage converter 603, an analog-to-digital converter 703 and a reference bias circuit 803. The analog-to-digital converter 703 may include a plurality of conversion circuits 713, 723, 733 and 743. FIG. 8 illustrates a non-limiting example of four conversion circuits and the number of the conversion circuits may be determined variously depending on range and resolution of resistance distribution to be measured.

The current-to-voltage converter 603 may include an NMOS transistor TNc that receives the cell current Ic and is diode-coupled to a ground voltage VSS (e.g., a ground voltage VSS line) to provide the cell bias voltage VBc.

The reference bias circuit 803 may include a current source CS, a current mirror TNe1 and TNe2, and a reference current-to-voltage converter TPe. The current source CS may generate a reference current Ir, and the current mirror TNe1 and TNe2 may generate a mirror current Im based on the reference current Ir. The reference current-to-voltage converter TPe may convert to the mirror current Im to the reference bias voltage VBr. As illustrated in FIG. 8, the current mirror TNe1 and TNe2 may include the two NMOS transistors and the reference current-to-voltage converter TPe may include a PMOS transistor that receives the mirror current Im and is diode-coupled to the power supply voltage VDD to provide the reference bias voltage VBr.

In one embodiment, each of the conversion circuits 713, 723, 733 and 743 may include a PMOS transistor TPi (i=1, 2, 3, 4), an NMOS transistor TNi and an inverter INVi. The PMOS transistor TPi is coupled between a power supply voltage VDD and a sampling node Ni, and a gate of the PMOS transistor TPi receives the reference bias voltage VBr. The NMOS transistor TNi is coupled between the sampling node Ni and the ground voltage VDD, and a gate of the NMOS transistor TNi receives the cell bias voltage VBc. The inverter INVi generates each bit signal TCi based on a voltage on the sampling node Ni.

In one embodiment, the PMOS transistor TPi may have a size increasing or decreasing gradually with respect to the conversion circuits 713, 723, 733 and 743. For example, the sizes of the PMOS transistors TP1, TP2, TP3 and TP4 may be increased gradually. In this case, the operation currents I1, I2, I3 and I4 may be increased gradually such that the operation current I1 of the first conversion circuit 713 is smallest and the operation current I4 of the last conversation unit 743 is greatest. In another example embodiment, the sizes of the PMOS transistors TP1, TP2, TP3 and TP4 may be decreased gradually. In this case, the operation currents I1, I2, I3 and I4 may be decreased gradually such that the operation current I1 of the first conversion circuit 713 is greatest and the operation current I4 of the last conversation circuit 743 is smallest.

As illustrated in FIG. 8, the NMOS transistor TNc (e.g., a first type transistor) in the current-to-voltage converter 603 and the NMOS transistor TNi in each of the conversion circuits 713, 723, 733 and 743 may form a current mirror to provide the cell bias voltage VBc from the current-to-voltage converter 603 to each of the conversion circuits 713, 723, 733 and 743. In addition, as illustrated in FIG. 8, the PMOS transistor TPe (e.g., a second type transistor) in the reference bias circuit 803 and the PMOS transistor TPi in each of the conversion circuits 713, 723, 733 and 743 may form a current mirror to provide the reference bias voltage VBc from the reference bias circuit 803 to each of the conversion circuits 713, 723, 733 and 743.

Figure 9:
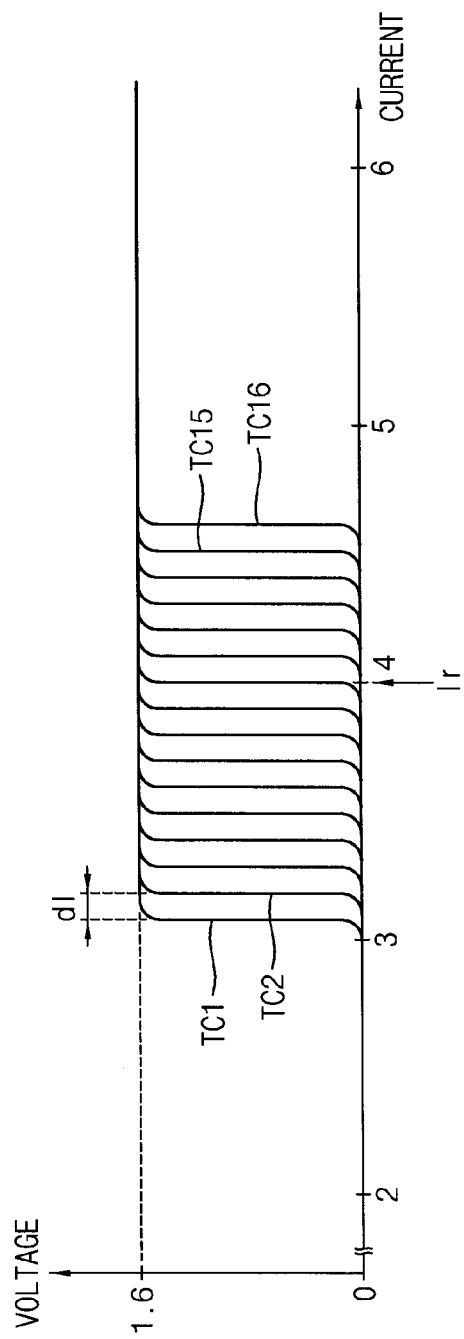
FIG. 9 is a diagram illustrating an example of bit signals of a temperature code generated by an on-chip resistance measurement circuit.

FIG. 9 is a diagram illustrating an example of bit signals of a temperature code generated by an on-chip resistance measurement circuit.

In FIG. 9, the horizontal axis represents a cell current in unit of, for example, micro ampere uA and the vertical axis represents a voltage level of the bit signals of a temperature code in unit of volt V. As described above, the bit signals TC1 through TC16 of the temperature code may be generated using sixteen conversion circuits of different operation currents I1 through I16. FIG. 9 illustrates an example that the operation currents I1 through I16 increase gradually such that the operation current I1 corresponding to the first bit signal TC1 is smallest and the operation current I16 corresponding to the last bit signal TC16 is greatest.

As illustrated in FIG. 9, the bit signals TC1 through TC16 may transition from logic low level to logic high level one by one whenever the cell current Ic increases by the increment of, for example, 100 nA (nano ampere). For example, the on-chip resistance measurement circuit corresponding to the example of FIG. 9 may have a resolution of 100 nA (e.g., dI), and a reference current Ir may be 3.9 uA. The resolution of the on-chip resistance measurement circuit may be determined by adjusting the internal resistance increment of the conversion circuits, that is, the size increment of the transistors in the conversion circuits. The range of the measurable cell current may be determined by the above-mentioned reference bias voltage VBr and the number of the conversion circuits.

The reference bias voltage VBr may be varied according to the reference current Ir of the current source CS in FIG. 8. Thus the sourcing capacity of the current source CS may be adjusted depending on design of the circuit to determine the reference bias voltage VBr. In an example embodiment, the current source CS may be implemented with a variable current source configured to vary the reference current Ir based on an external control signal. For example, the reference bias voltage VBr may be determined by adjusting the external control signal.

Figure 10:
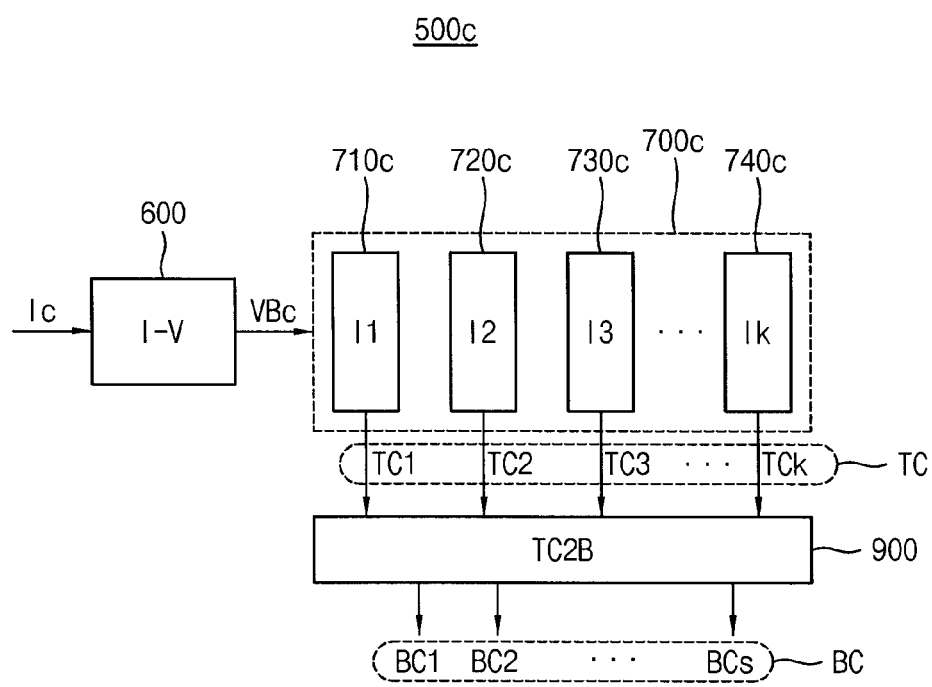
FIG. 10 is a block diagram illustrating an on-chip resistance measurement circuit according to example embodiments.

FIG. 10 is a block diagram illustrating an on-chip resistance measurement circuit according to example embodiments.

Referring to FIG. 10, an on-chip resistance measurement circuit 500c may include a current-to-voltage converter (I-V) 600, an analog-to-digital converter 700c and a code conversion circuit 900.

The current-to-voltage converter 600 may convert the cell current Ic to a cell bias voltage VBc. The analog-to-digital converter 700c may include a plurality of conversion circuits 710c, 720c, 730c and 740c. Each of the conversion circuits 710c, 720c, 730c and 740c may receive the cell bias voltage VBc to generate each of the operation currents I1 through Ik different from each other and generate each of the bit signals TC1 through TCk based on each of the operation currents I1 through Ik. The code conversion circuit 900 may convert the bit signals TC1 through TCk of the temperature code TC to bit signals BC1 through BCs of a binary code BC. The relations between the temperature code TC and the binary code BC are described with reference to FIG. 12.

In one embodiment, the internal resistances of the conversion circuits 710c, 720c, 730c and 740c may be decreased gradually and the operation currents I1 through Ik may be increased gradually such that the operation current I1 of the first conversion circuit 710c is smallest and the operation current Ik of the last conversation unit 740c is greatest. In another embodiment, the internal resistances of the conversion circuits 710c, 720c, 730c and 740c may be increased gradually and the operation currents I1 through Ik may be decreased gradually such that the operation current I1 of the first conversion circuit 710c is greatest and the operation current Ik of the last conversation unit 740c is smallest. The different operation currents I1 through Ik, that is, the different internal resistances of the conversion circuits 710c, 720c, 730c and 740c may be implemented using transistors having different sizes.

Figure 11:
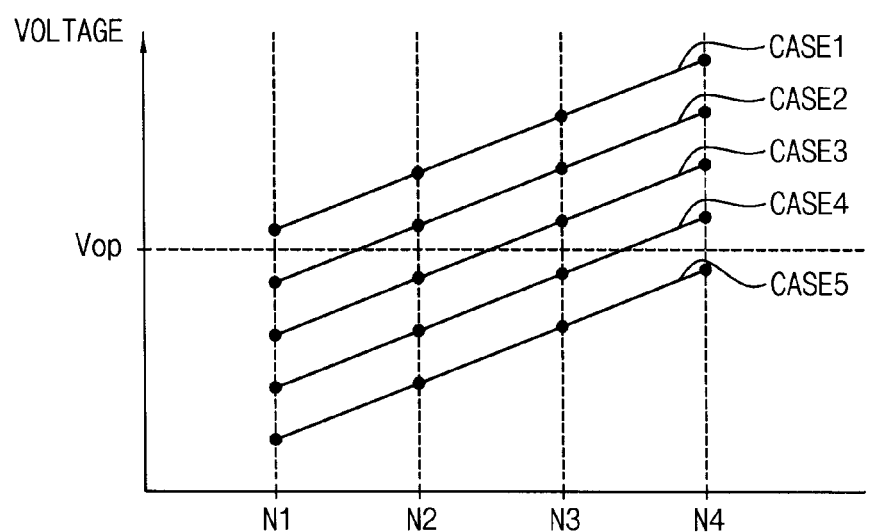
FIG. 11 is an exemplary diagram illustrating voltages on sampling nodes according to cell resistances.

FIG. 11 is an exemplary diagram illustrating voltages on sampling nodes according to cell resistances, and FIG. 12 is an exemplary diagram for describing relations between a temperature code and a binary code.

FIG. 11 illustrates voltages on the sampling nodes N1, N2, N3 and N4, for example, in FIG. 8 for five cases CASE1 through CASE5. With respect to each of the cases CASE1 through CASE5, the sampling node N1 of the conversion circuit 713 having the smallest operation current I1 has the lowest voltage level and the sampling node N4 of the conversion circuit 743 having the greatest operation current I4 has the highest voltage level. The cases CASE1 through CASE5 represent the increasing cell current. For example, the first case CASE1 corresponds to relatively the smallest cell current and the fifth case CASE5 corresponds to relatively the greatest cell current. As illustrated in FIG. 11, the voltages on the sampling nodes N1 through N4 of the voltages on the input nodes of the inverters decrease as the cell current increases from CASE1 to CASE5. The operation voltage Vop may correspond to a boundary voltage level between logic high level and logic low level of the bit signals TC1 through TC4 of the temperature code TC.

FIG. 12 illustrates the temperature code TC, the binary code BC and the decimal value DV for the five cases CASE1 through CASE5 of FIG. 11. As illustrated in FIG. 12, the bits of the temperature code TC transition from logic low value of 0 to logic high value of 1 sequentially one by one as the cell current increases from CASE1 to CASE5.

For example, the cell current Ic may be measured and digitalized in a chip using the on-chip resistance measurement circuit according to example embodiments. The digitalized binary code TC or binary code BC may be provided to the external. The measured cell current Ic may represent the cell resistance Rc of the selected resistive memory cell. The cell resistance distribution of the resistive memory device may be obtained by measuring the cell currents of a plurality of resistive memory cells.

Figure 13:
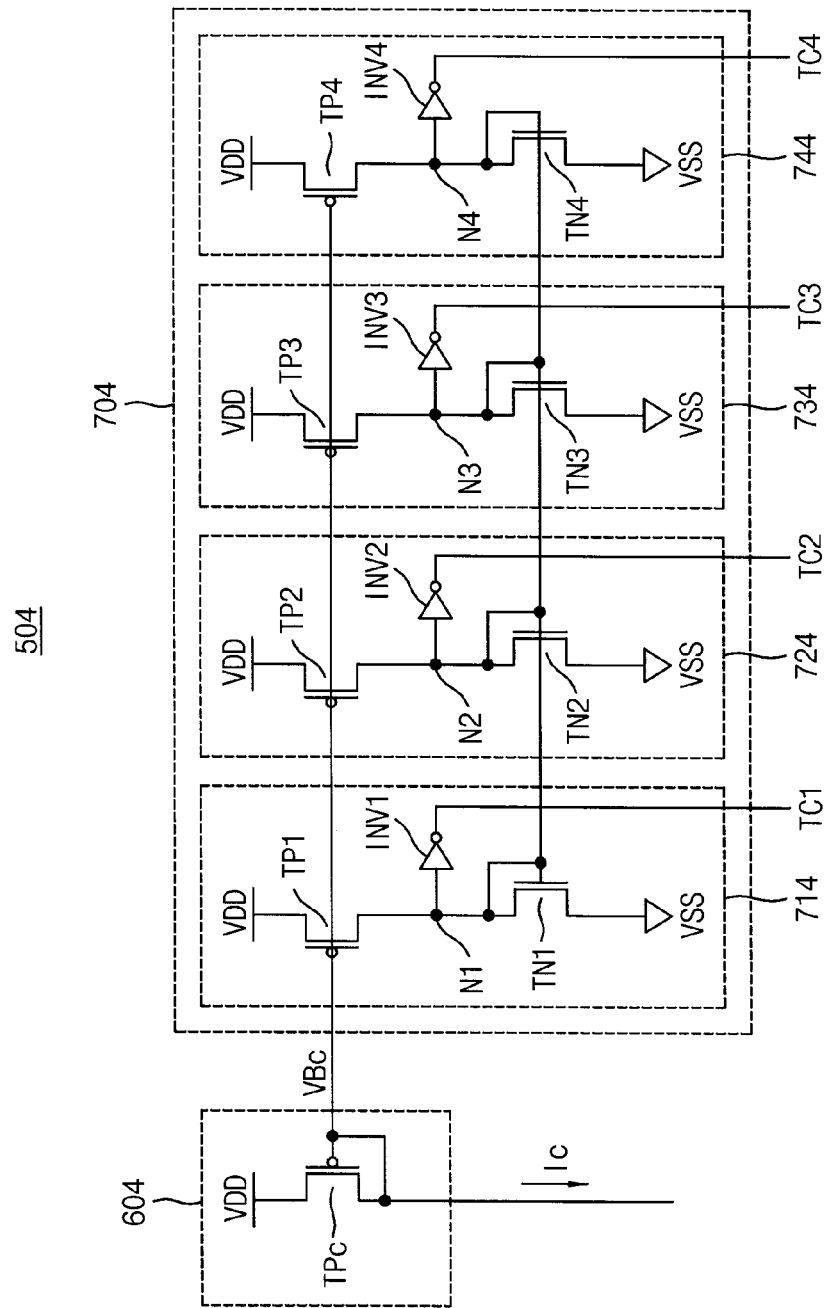
FIGS. 13, 14 and 15 are circuit diagrams illustrating on-chip resistance measurement circuits according to example embodiments.
Figure 14:
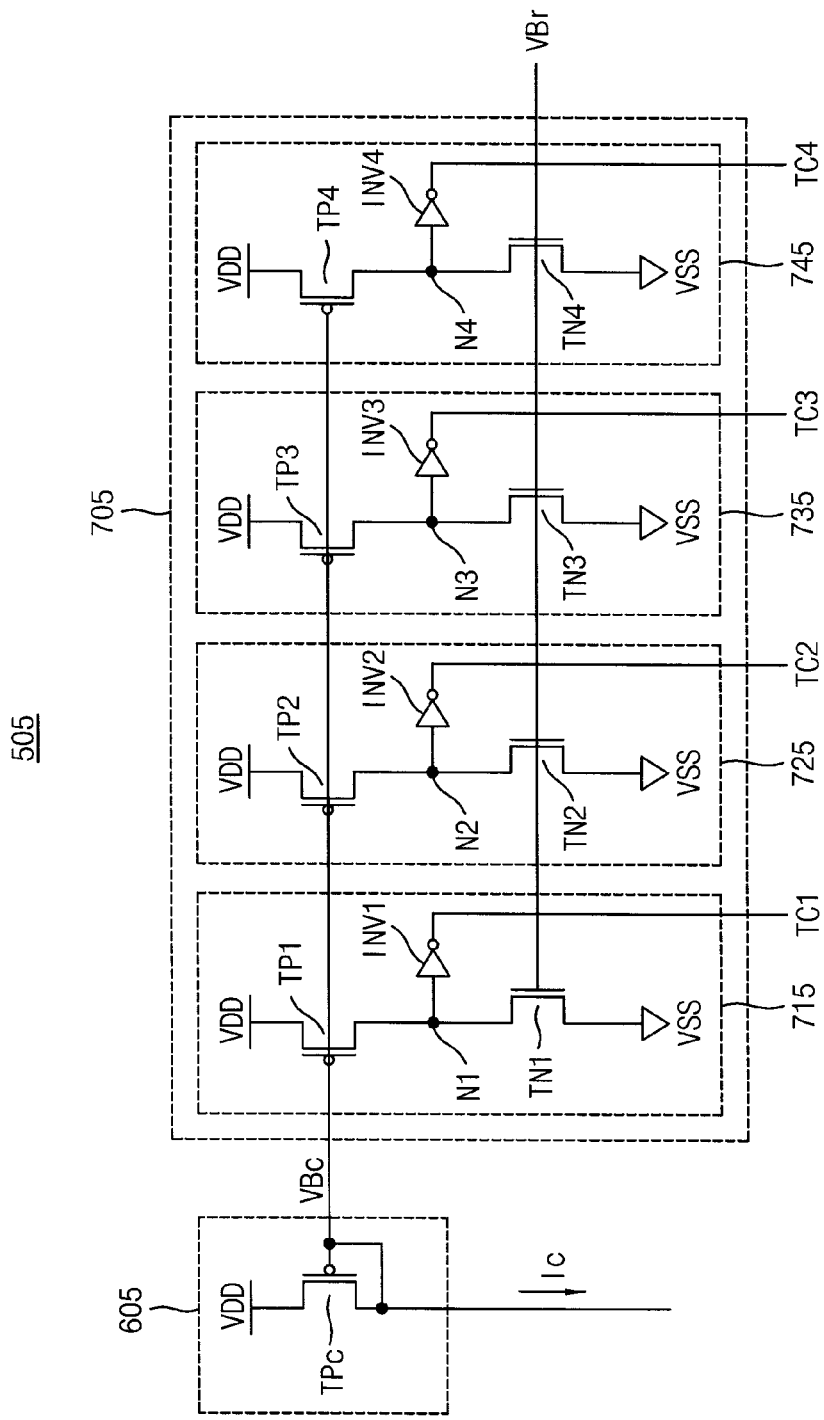
Figure 15:
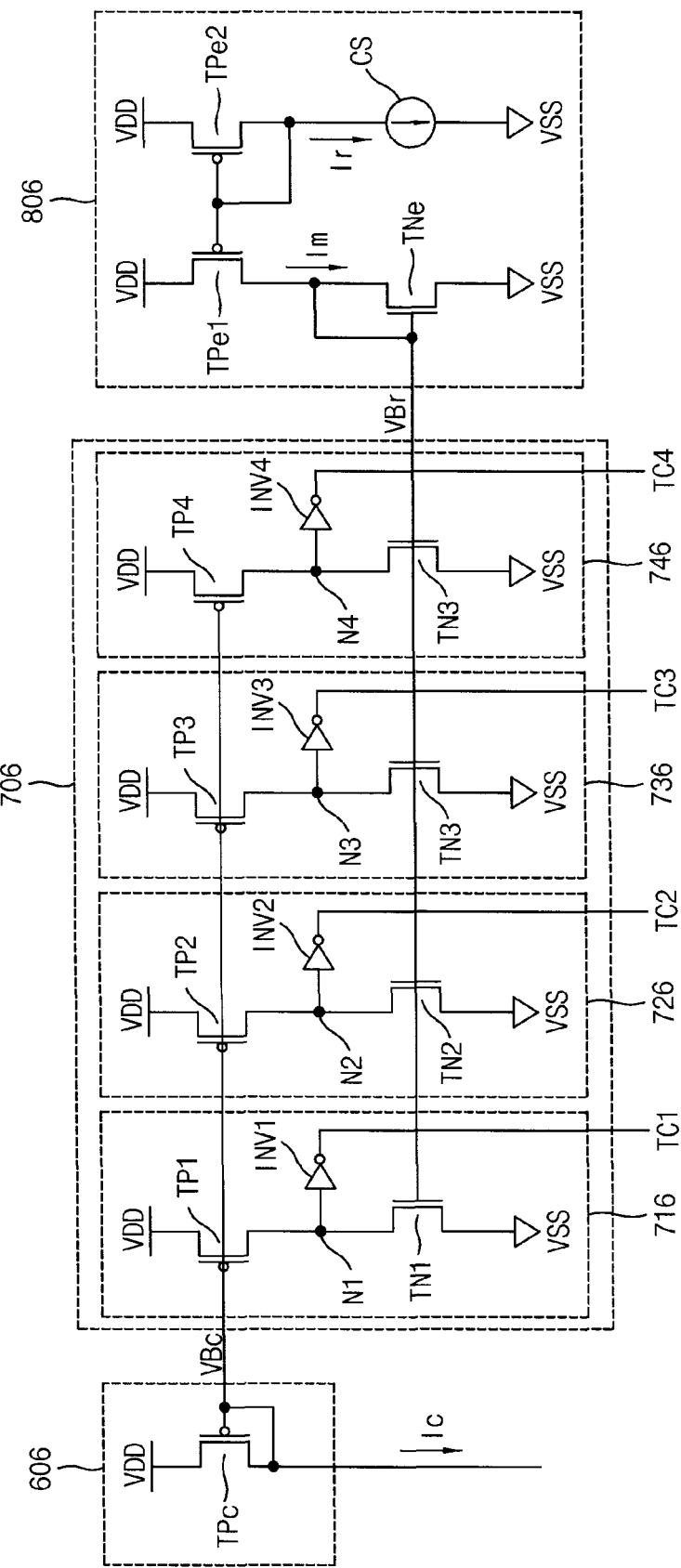

FIGS. 13, 14 and 15 are circuit diagrams illustrating on-chip resistance measurement circuits according to example embodiments.

Referring to FIG. 13, an on-chip resistance measurement circuit 504 may include a current-to-voltage converter 604 and an analog-to-digital converter 704. The analog-to-digital converter 704 may include a plurality of conversion circuits 714, 724, 734 and 744. FIG. 13 illustrates a non-limiting example of four conversion circuits and the number of the conversion circuits may be determined variously depending on range and resolution of resistance distribution to be measured.

The current-to-voltage converter 604 may include a PMOS transistor TPc that flows the cell current Ic and is diode-coupled to the power supply voltage VDD to provide the cell bias voltage VBc. Each of the conversion circuits 714, 724, 734 and 744 may include a PMOS transistor TPi (i=1, 2, 3, 4), an NMOS transistor TNi and an inverter INVi. The PMOS transistor TPi is coupled between the power supply voltage VDD and a sampling node Ni, and a gate of the PMOS transistor TPi receives the cell bias voltage VBc. The NMOS transistor TNi is diode-coupled between the sampling node Ni and the ground voltage VSS. The inverter INVi generates each bit signal TCi based on a voltage on the sampling node Ni.

In one embodiment, the NOS transistors TNi has a size increasing or decreasing gradually with respect to the conversion circuits 714, 724, 734 and 744. For example, the sizes of the NMOS transistors TN1, TN2, TN3 and TN4 may be increased gradually when the operation currents I1, I2, I3 and I4 are increased gradually such that the operation current I1 of the first conversion circuit 714 is smallest and the operation current I4 of the last conversation unit 744 is greatest. In another example embodiment, the sizes of the NMOS transistors TN1, TN2, TN3 and TN4 may be decreased gradually when the operation currents I1, I2, I3 and I4 are decreased gradually such that the operation current I1 of the first conversion circuit 714 is greatest and the operation current I4 of the last conversation circuit 744 is smallest. In some example embodiments, the analog-to-digital converter 704 may be designed such that only the sizes of the PMOS transistors TP1, TP2, TP3 and TP4 are varied or only the sizes of the NMOS transistors TN1, TN2, TN3 and TN4 are varied. In other example embodiments, the analog-to-digital converter 704 may be designed such that both of the sizes of the PMOS transistors TP1, TP2, TP3 and TP4 and the sizes of the NMOS transistors TN1, TN2, TN3 and TN4 are varied.

As illustrated in FIG. 13, the PMOS transistor TPc in the current-to-voltage converter 604 and the PMOS transistor TPi in each of the conversion circuits 714, 724, 734 and 744 may form a current mirror to provide the cell bias voltage VBc from the current-to-voltage converter 604 to each of the conversion circuits 714, 724, 734 and 744.

Referring to FIG. 14, an on-chip resistance measurement circuit 505 may include a current-to-voltage converter 605 and an analog-to-digital converter 705. The analog-to-digital converter 705 may include a plurality of conversion circuits 715, 725, 735 and 745. FIG. 14 illustrates a non-limiting example of four conversion circuits and the number of the conversion circuits may be determined variously depending on range and resolution of resistance distribution to be measured.

The current-to-voltage converter 605 may include a PMOS transistor TPc that flows the cell current Ic and is diode-coupled to the power supply voltage VDD to provide the cell bias voltage VBc. Each of the conversion circuits 715, 725, 735 and 745 may include a PMOS transistor TPi (i=1, 2, 3, 4), an NMOS transistor TNi and an inverter INVi. The PMOS transistor TPi is coupled between the power supply voltage VDD and a sampling node Ni, and a gate of the PMOS transistor TPi receives the cell bias voltage VBc. The NMOS transistor TNi is coupled between the sampling node Ni and the ground voltage VSS, and a gate of the NMOS transistor TNi receives the reference bias voltage VBr. The inverter INVi generates each bit signal TCi based on a voltage on the sampling node Ni.

In one embodiment, the NOS transistors TNi has a size increasing or decreasing gradually with respect to the conversion circuits 715, 725, 735 and 745.

As illustrated in FIG. 14, the PMOS transistor TPc in the current-to-voltage converter 605 and the PMOS transistor TPi in each of the conversion circuits 715, 725, 735 and 745 may form a current mirror to provide the cell bias voltage VBc from the current-to-voltage converter 605 to each of the conversion circuits 715, 725, 735 and 745.

Referring to FIG. 15, an on-chip resistance measurement circuit 506 may include a current-to-voltage converter 606, an analog-to-digital converter 706 and a reference bias circuit 806. The analog-to-digital converter 706 may include a plurality of conversion circuits 716, 726, 736 and 746. FIG. 15 illustrates a non-limiting example of four conversion circuits and the number of the conversion circuits may be determined variously depending on range and resolution of resistance distribution to be measured.

The current-to-voltage converter 606 may include a PMOS transistor TPc that flows the cell current Ic and is diode-coupled to the power supply voltage VDD to provide the cell bias voltage VBc.

The reference bias circuit 806 may include a current source CS, a current mirror TPe1 and TPe2, and a reference current-to-voltage converter TNe. The current source CS may generate a reference current Ir, and the current mirror TPe1 and TPe2 may generate a mirror current Im based on the reference current Ir. The reference current-to-voltage converter TNe may convert to the mirror current Im to the reference bias voltage VBr. As illustrated in FIG. 15, the current mirror TPe1 and TPe2 may include the two PMOS transistors and the reference current-to-voltage converter TNe may include an NMOS transistor that receives the mirror current Im and is diode-coupled to the ground voltage VSS to provide the reference bias voltage VBr.

Each of the conversion circuits 716, 726, 736 and 746 may include a PMOS transistor TPi (i=1, 2, 3, 4), an NMOS transistor TNi and an inverter INVi. The PMOS transistor TPi is coupled between a power supply voltage VDD and a sampling node Ni, and a gate of the PMOS transistor TPi receives the cell bias voltage VBc. The NMOS transistor TNi is coupled between the sampling node Ni and the ground voltage VSS, and a gate of the NMOS transistor TNi receives the reference bias voltage VBc. The inverter INVi generates each bit signal TCi based on a voltage on the sampling node Ni.

In one embodiment, the NMOS transistor TNi may have a size increasing or decreasing gradually with respect to the conversion circuits 716, 726, 736 and 746.

As illustrated in FIG. 15, the PMOS transistor TPc (e.g., a first type) in the current-to-voltage converter 606 and the PMOS transistor TPi in each of the conversion circuits 716, 726, 736 and 746 may form a current mirror to provide the cell bias voltage VBc from the current-to-voltage converter 606 to each of the conversion circuits 716, 726, 736 and 746. In addition, as illustrated in FIG. 15, the NMOS transistor TNe (e.g., a second type) in the reference bias circuit 806 and the NMOS transistor TNi in each of the conversion circuits 716, 726, 736 and 746 may form a current mirror to provide the reference bias voltage VBc from the reference bias circuit 806 to each of the conversion circuits 716, 726, 736 and 746.

Figure 16:
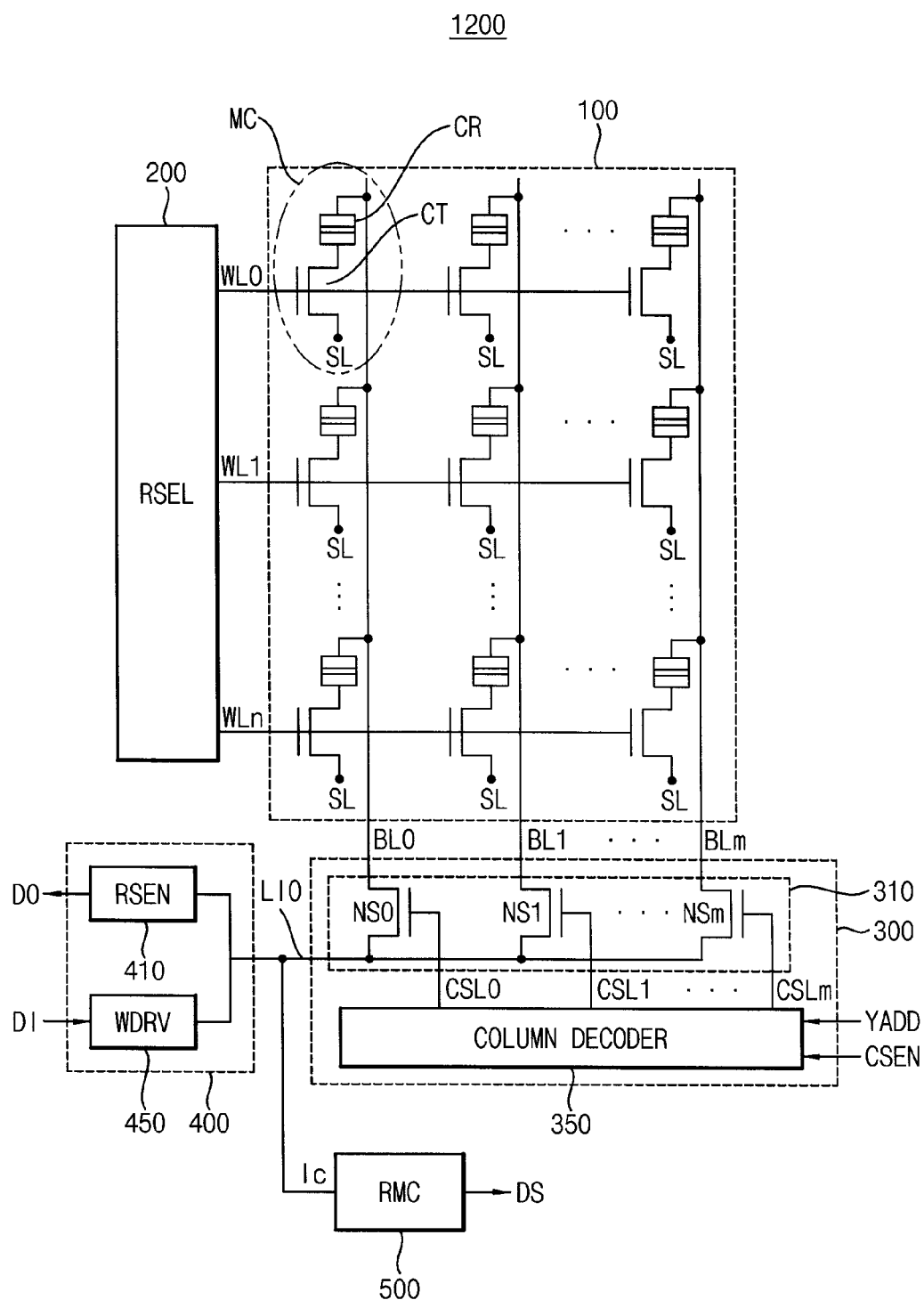
FIG. 16 is an exemplary diagram illustrating a resistive memory device according to example embodiments.

FIG. 16 is an exemplary diagram illustrating a resistive memory device according to example embodiments.

FIG. 16 illustrates a resistive memory device 1200 including a local input-output circuit 400 that is coupled to the bitlines BL0 through BLm via a single local line LIO. Some components of the resistive memory device 1200 are omitted in FIG. 16 for convenience of illustration.

Referring to FIG. 16, a memory cell array 100 includes a plurality of resistive memory cells MC, which are disposed at the positions crossed by the wordlines WL0~WLn and the bitlines BL0~BLm.

Each resistive memory cell MC may include a cell transistor CT and a resistive element CR. The resistive memory cell MC may have a resistance depending on programmed data. Example embodiments of the resistive memory cell MC are described with reference to FIGS. 17A through 20H. The cell transistor CT is turned on when the corresponding wordline is selected and enabled by the row selection circuit 200. The row selection circuit 200 may include a row decoder for decoding the row address signal XADD and a wordline driver circuit for applying a wordline selection voltage or a wordline non-selection voltage to the wordlines WL0~WLn, respectively, in response to the outputs of the row decoder.

The cell transistor CT and the resistive element CR in each resistive memory cell MC are coupled between a source line SL and one of the bitlines BL0~BLm. Even though not illustrated in FIG. 16, a plurality of resistive memory cells MCs may be coupled to the common source line. In some embodiments, the memory cell array 100 may be partitioned into at least two cell regions and the cell regions may be coupled to the different source lines.

The resistive memory cell MC may be implemented with a phase-change random access memory (PRAM) cell using phase-change materials, a resistance random access memory (RRAM) cell using complex metal oxide of variable resistance, a ferroelectrics random access memory (FRAM) cell using ferroelectric materials and a magneto-resistive random access memory (MRAM) cell using ferromagnetic materials. In particular, the resistive memory cell MC may be implemented with a spin-transfer torque magneto-resistive random access memory (STT-MRAM) cell. In this case, the resistive element CR may be implemented with a magnetic tunnel junction (MTJ) element of magnetic materials. Such resistive materials of the resistive element may have the resistance value depending on the magnitude and/or the direction of the applied current or voltage and have characteristics of non-volatility of maintaining the resistance value even though power is off.

The bitlines BL0~BLm are coupled to a write driver WDRV. The write driver WDRV may be enabled in response to the reception of the write command WR and may perform a write operation by applying a current or voltage to the resistive memory cell via the corresponding bitline.

The column selection circuit 300 may include a column gating circuit 310 and a column decoder 350 for selecting the bitline corresponding to the column address signal YADD. The column decoder 350 generates column select signals CSL0~CSLm to select one of the bitlines BL0~BLm in response to the column address signal YADD and the column selection enable signal CSEN. The column selection enable signal CSEN may be provided from the timing control logic (not shown). The column gating circuit 310 may include a plurality of switches NS0~NSm coupled to the bitlines BL0~BLm. The switches NS0~NSm are turned on selectively in response to the column select signals CSL0~CSLm. The switch corresponding to the column address signal YADD is turned on to select the bitline and a data voltage or a data current related with the resistance value of the resistive memory cell MC is transferred to the read sensing circuit 410 through the selected bitline. As illustrated in FIG. 16, the switches NS0~NSm may be implemented with NMOS transistors.

The input-output circuit 400 may include a read sensing circuit RSEN 410 and a write driver WDRV 450. The input-output circuit 400 may be coupled to the bitlines via the column selection circuit 300. The read sensing circuit 410 may perform a read operation to sense the data stored in the resistive memory cell MC to provide the read data DO. The write driver may perform a write operation to write the input data DI in the resistive memory cell MC. The read sensing circuit 410 and the write driver 450 may be formed inseparably or separately.

The resistive memory device 1200 may include an on-chip resistance measurement circuit 500 such as described herein. The on-chip resistance measurement circuit 500 may receive the cell current Ic corresponding to the cell resistance of the selected memory cell among the resistive memory cells MC. The on-chip resistance measurement circuit 500 may generate the digital signal DS representing the cell resistance based on the cell current Ic. The digital signal DS includes a plurality of bit signals and the bit signals may be the temperature code or the binary code as described above.

As illustrated in FIG. 16, the on-chip resistance measurement circuit 500 may be coupled to the local input-output line LIO. For example, the on-chip resistance measurement circuit 500 may be coupled between the column selection circuit 300 and the read-write circuit 400, where the column selection circuit 300 is configured to selectively connect the read-write circuit 400 and the bitline coupled to the selected memory cell.

Figure 17A:
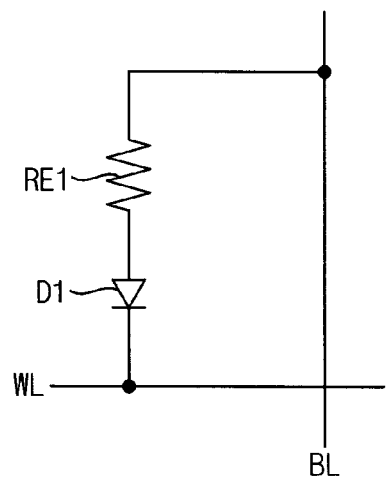
FIGS. 17A and 17B are diagrams illustrating examples of a resistive memory cell included in a resistive cell array.
Figure 17B:
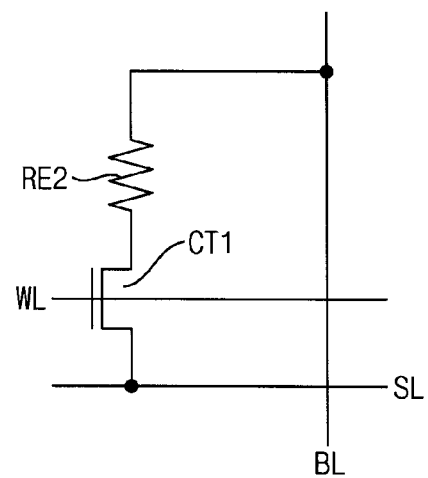

FIGS. 17A and 17B are diagrams illustrating examples of a resistive memory cell included in a resistive cell array.

Referring to FIG. 17A, a memory cell may include a resistive element RE1 and a diode D1 serially coupled between a bitline BL and a wordline WL. The memory cell of FIG. 17A may determine a resistance distribution of the resistive element RE1 by controlling voltages applied to the bitline BL and the wordline WL. The configuration of the memory cell of FIG. 17A may be adopted when the resistive element RE1 is a unipolar type. The write operation may be performed by applying the voltages to the bitline BL and the wordline WL, thereby controlling a voltage difference between both ends of the resistive element RE1 or controlling a current flowing through the resistive element RE1.

Referring to FIG. 17B, a memory cell may include a resistive element RE2 and a switching element, such as a cell transistor CT1, serially coupled between a bitline BL and a source line SL. A gate of the cell transistor CT1 is coupled to a wordline WL. The memory cell of FIG. 17B may determine a resistance distribution of the resistive element RE2 by controlling voltages applied to the bitline BL and the common source line CSL. The configuration of the memory cell of FIG. 17B may be adopted when the resistive element RE2 is a bipolar type as well as a unipolar type.

When the resistive element RE2 is a unipolar type, a resistance value of the resistive element RE2 is controlled by magnitude of applied voltage. When the resistive element RE2 is a bipolar type, the resistance value of the resistive element RE2 may be controlled by direction (i.e. polarity) of the applied voltage as well as magnitude of the applied voltage. The write operation may be performed by applying the voltages to the bitline BL and the source line SL, thereby controlling a voltage difference between both ends of the resistive element RE2 or controlling a current flowing through the resistive element RE2.

Figure 18A:
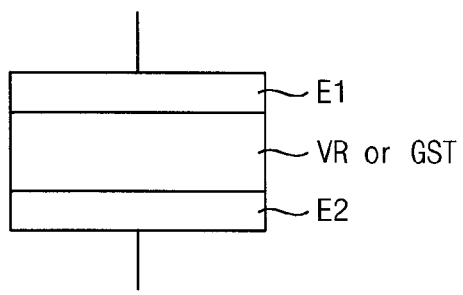
FIGS. 18A and 18B are diagrams illustrating examples of a resistive element included in a resistive memory cell.
Figure 18B:
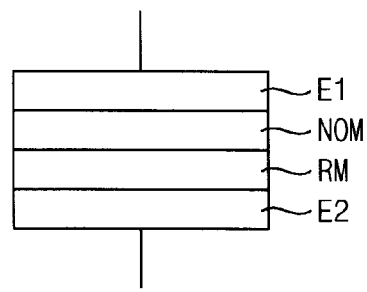

FIGS. 18A and 18B are diagrams illustrating examples of a resistive element included in a resistive memory cell.

Referring to FIG. 18A, the resistive element RE1 of FIG. 17A or the resistive element RE2 of FIG. 17B may include a first electrode E1, a second electrode E2 and resistive material between the electrodes E1 and E2. The electrodes E1 and E2 may be formed with metal such as tantalum (Ta), platinum (Pt), etc. The resistive material may include transition-metal oxide (VR) such as cobalt oxide, or phase change material such as GeSbTe (GST), etc. The phase change material may be in amorphous state or in crystalline state depending on heating time and/or heating temperature, and thus the phase change material may change its resistance according to phase change.

PRAM using phase change materials, RRAM using materials having variable resistance, and MRAM using ferromagnetism materials may be differentiated from each other, and those may be totally referred to as resistive memories. Method and devices according to example embodiments may be applied to various resistive memories including PRAM, RRAM and MRAM.

The resistive material between the electrodes E1 and E2 is required to have a plurality of stable states having different resistance, and various resistive materials are being studied.

For example, while increasing a voltage applied to material having characteristic of Negative Differential Resistance (NDR), resistance of the NDR material abruptly increases at a reset voltage (Vreset), the relatively high resistance is maintained afterwards, and then the NDR material transitions to a state of relatively low resistance at a set voltage (Vset). In this case, the set voltage (Vset) for decreasing the resistance of the NDR material is greater than the reset voltage (Vreset) for decreasing the resistance of the NDR material.

Chalcogenide using telluride compound such as GeSbTe has relatively high resistance when relatively low voltage is applied, and transitions to a state of relatively low resistance if a sufficiently high voltage is applied. In this case, the set voltage (Vset) for decreasing the resistance of the Chalcogenide is smaller than the reset voltage (Vreset) for decreasing the resistance of the Chalcogenide.

For example, an on-state of relatively low resistance and an off-state of relatively high resistance may be programmed or written into memory cells by applying the set voltage (Vset) and the reset voltage (Vreset) corresponding to characteristics of various materials included in the memory cells.

Referring to FIG. 18B, the resistive element RE2 of FIG. 17B may include a first electrode E1, a second electrode E2, non-ohmic material (NOM) and resistive material (RM) between the electrodes E1 and E2. In this case, the on-state and the off-state may be programmed or written into memory cells by applying opposite voltages to the electrodes E1 and E2. In other words, the on-state and the off-state may be determined according to polarity of the applied voltage.

Figure 19:
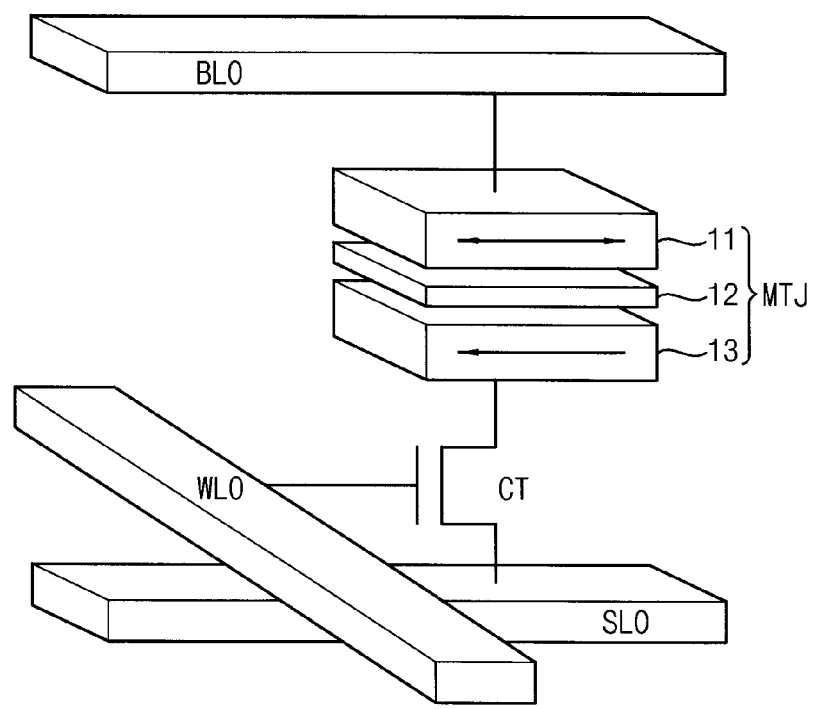
FIG. 19 is a diagram illustrating an example of a spin-transfer torque magneto-resistive random access memory (STT-MRAM) cell included in a resistive cell array.

FIG. 19 is a diagram illustrating an example of a spin-transfer torque magneto-resistive random access memory (STT-MRAM) cell included in a resistive cell array.

Referring to FIG. 19, the STT-MRAM cell may include an MTJ element and a cell transistor CT. A gate of the cell transistor CT is coupled to a corresponding wordline WL0, a first electrode of the cell transistor CT is coupled to a corresponding bitline BL0 via the MTJ element, and a second electrode of the cell transistor CT is coupled to a source line SL0.

The MTJ element may include a pinned layer 13, a free layer 11 and a barrier layer 12 between the two layers 11 and 13. The magnetization direction of the pinned layer 13 is fixed but the magnetization direction of the free layer 11 may be varied, according to the written data, between the same direction as or opposite direction to the magnetization direction of the pinned layer 13. In one example embodiment, an anti-ferromagnetic layer may be further included in the MTJ element to enforce the magnetization direction of the pinned layer 13.

For example, to perform the write operation of the STT-MRAM cell, a high level voltage is applied to the wordline WL0 to turn on the cell transistor CT, and a write current is applied between the bitline BL0 and the source line SL0.

For example, to perform the read operation of the STT-MRAM cell, a high level voltage is applied to the wordline WL0 to turn on the cell transistor CT, a read current is applied to flow from the bitline BL0 to the source line SL0, and the resistance value is measured to determine the data stored in the MTJ element.

Figure 20A:
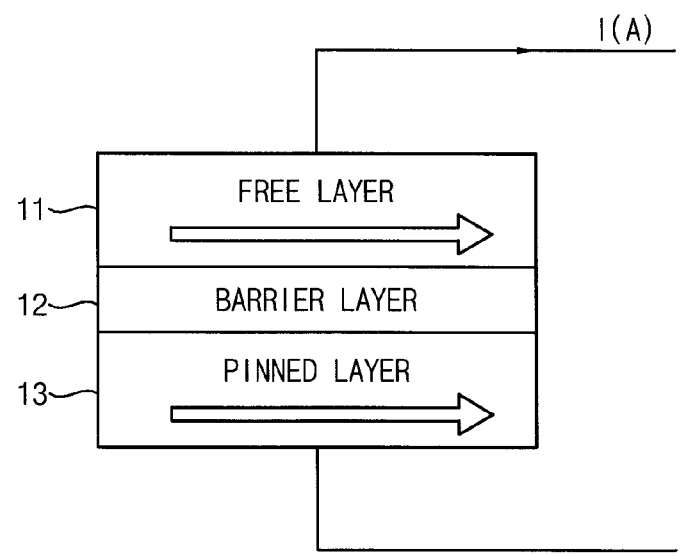
FIGS. 20A and 20B are diagrams illustrating magnetization directions of a magnetic tunnel junction (MTJ) element depending on written data.
Figure 20B:
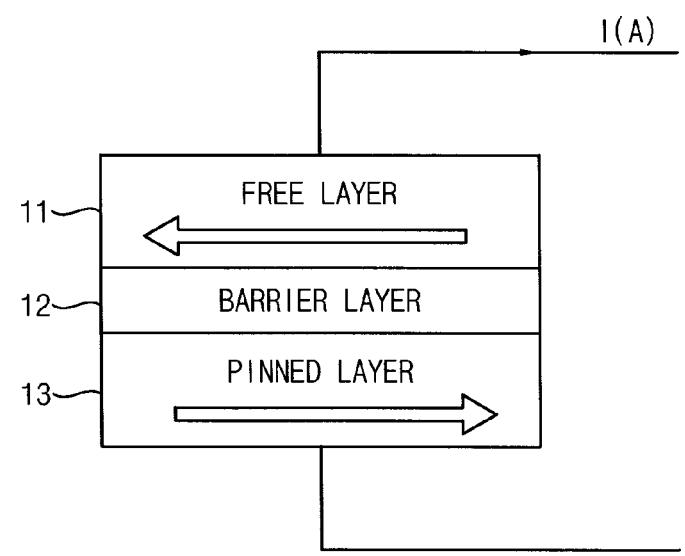

FIGS. 20A and 20B are diagrams illustrating magnetization directions of a magnetic tunnel junction (MTJ) element depending on written data.

The resistance value of the MTJ element may be changed according to the magnetization direction of the free layer 11. When the read current I(A) is applied to the MTJ element, the data voltage depending on the resistance value of the MTJ element is output. The magnitude of the read current I(A) is much smaller than the magnitude of a write current and thus the magnetization direction of the free layer is not changed due to the read current I(A).

Referring to FIG. 20A, the magnetization direction of the free layer 11 may be arranged parallel with the magnetization direction of the pinned layer 13. In this case, the MTJ element has a relatively smaller resistance value and the data '0' may be read out by applying the read current I(A).

Referring to FIG. 20B, the magnetization direction of the free layer 11 may be arranged opposite to the magnetization direction of the pinned layer 13. In this case, the MTJ element has a relatively greater resistance value and the data '1' may be read out by applying the read current I(A).

Figure 20C:
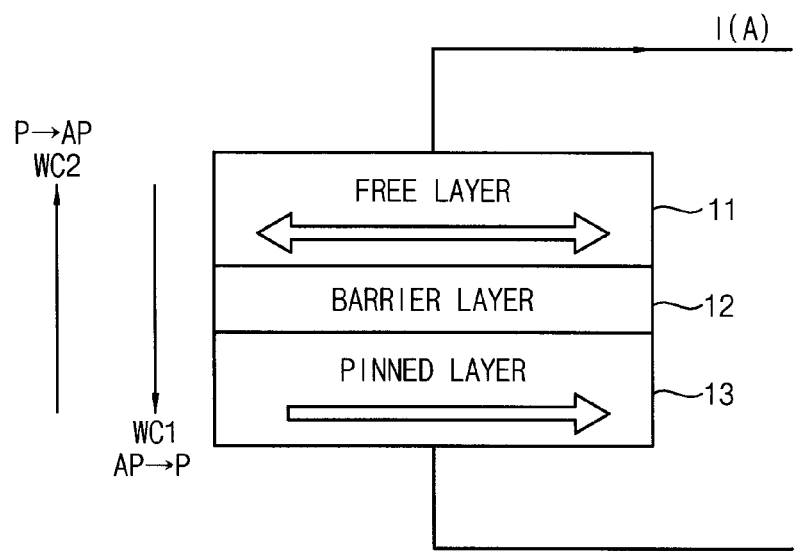
FIG. 20C is a diagram for describing a write operation of the STT-MRAM cell.

FIG. 20C is a diagram for describing a write operation of the STT-MRAM cell.

Referring to FIG. 20C, the magnetization direction of the free layer 11 may be determined depending on the write currents WC1 and WC2. For example, when the first write current WC1 is applied to the MTJ element, the free electrons having the same spin direction as the pinned layer 13 apply a torque to the free layer 11 and thus the free layer 11 is magnetized in the same direction as, that is, parallel direction (P) with the pinned layer 13. When the second write current WC2 is applied to the MTJ element, the free electrons having the opposite spin direction to the pinned layer 13 apply a torque to the free layer 11 and thus the free layer 11 is magnetized in the opposite direction as, that is, anti-parallel direction (AP) with the pinned layer 13. As such, the magnetization direction of the free layer 11 in the MTJ element may be changed by the spin transfer torque (STT).

FIGS. 20D, 20E, 20F, 20G and 20H are diagrams illustrating examples of the MTJ element in the STT-MRAM cell.

Figure 20D:
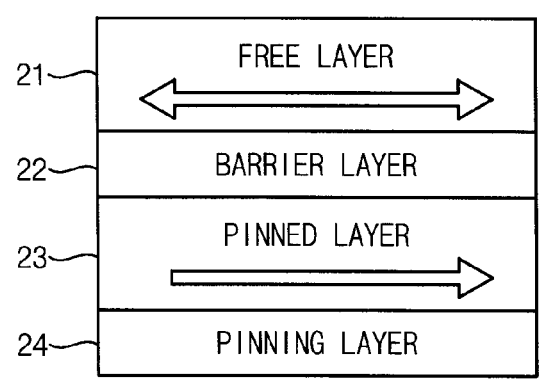
FIGS. 20D, 20E, 20F, 20G and 20H are diagrams illustrating examples of the MTJ element in the STT-MRAM cell.
Figure 20E:
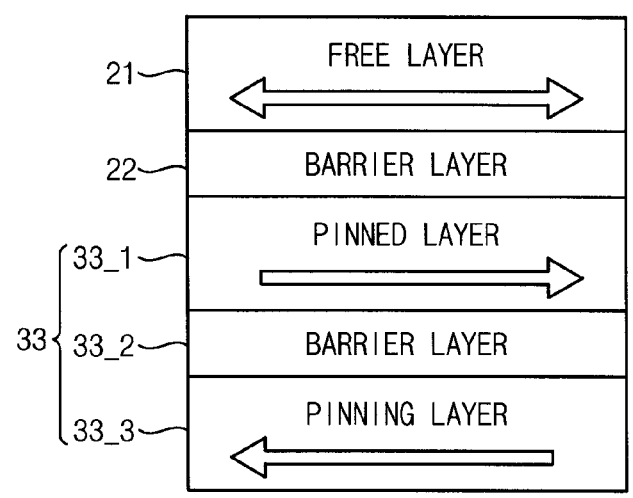

FIGS. 20D and 20E illustrate examples of the MTJ element having the horizontal magnetization, corresponding to a case that the direction of an applied current is perpendicular to the easy-magnetization axis.

Referring to FIG. 20D, an MTJ element 20 may include a free layer 21, a barrier layer 22, a pinned layer 23 and a pinning layer 24.

The free layer 21 may include materials having a variable magnetization direction. The magnetization direction of the free layer 21 may be varied depending on internal and/or external electrical and/or magnetic factors. The free layer 21 may be implemented with ferromagnetic materials including at least one of cobalt (Co), iron (Fe) and nickel (Ni). For example, the free layer 21 may include at least one of FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO and Y3Fe5O12.

The barrier layer 22 may have a width shorter than a spin diffusion distance. The barrier layer 22 may be implemented with non-magnetic materials. For example, the barrier layer 22 may include at least one of Mg, Ti, Al, an oxide of MgZn or MgB, and a nitride of Ti or V.

The pinned layer 23 may have the magnetization direction that is fixed by the pinning layer 24. The pinned layer 23 may be implemented with ferromagnetic materials. For example, the pinned layer 23 may include at least one of FeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO and Y3Fe5O12.

The pinning layer 24 may be implemented with anti-ferromagnetic materials. For example, the pinning layer 24 may include at least one of PtMn, IrMn, MnO, MnS, MnTe, MnF2, FeCl2, FeO, CoCl2, CoO, NiCl2, NiO and Cr.

When the free layer and the pinned layer are implemented with ferromagnetic materials, a stray field may be generated in edge portions of the ferromagnetic materials. The stray field may decrease magneto-resistance or increase the resistive magnetism in the free layer, thereby causing asymmetric switching. Thus the MTJ element may require structure for reducing or controlling the stray field due to the ferromagnetic materials.

Referring to FIG. 20E, a fixed layer 33 in an MTJ element 30 may be implemented with synthetic anti-ferromagnetic (SAF). The fixed layer 33 may include a pinned layer 33_1, a barrier layer 33_2 and a pinning layer 33_3. Each of the pinned layer 33_1 and the pinning layer 33_3 may include at least one of CoFeB, Fe, Co, Ni, Gd, Dy, CoFe, NiFe, MnAs, MnBi, MnSb, CrO2, MnOFe2O3, FeOFe2O3, NiOFe2O3, CuOFe2O3, MgOFe2O3, EuO and Y3Fe5O12. The magnetization directions of the pinned layer 33_1 and the pinning layer 33_3 may be different from each other and the magnetization directions of the pinned layer 33_1 and the pinning layer 33_3 may be fixed, respectively. The barrier layer 33_2 may include Ru.

Figure 20F:
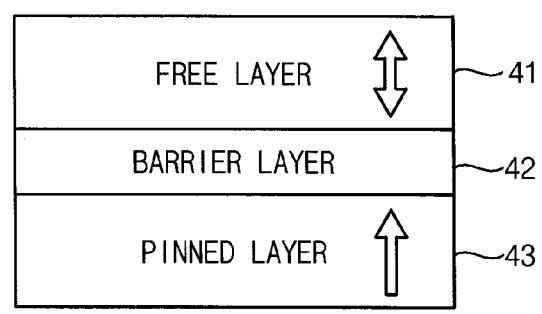

FIG. 20F illustrates an example of the MTJ element having the vertical magnetization, corresponds to a case that the direction of an applied current is parallel with the easy-magnetization axis.

Referring to FIG. 20F, an MTJ element 40 includes a free layer 41, a barrier layer 42 and a pinned layer 43. The MTJ element 40 has a relatively smaller resistance when the magnetization direction of the free layer 41 is parallel with the magnetization direction of the pinned layer 43, and the MTJ element 40 has a relatively greater resistance when the magnetization direction of the free layer 41 is opposite to the magnetization direction of the pinned layer 43. The data may be stored as the resistance value.

For example, to implement the MTJ element 40 having the vertical magnetization, the free layer 41 and the pinned layer 43 may be implemented with materials having higher magnetic anisotropic energy such as alloys of amorphous rare-earth elements, multilayer thin films as (Co/Pt)n and (Fe/Pt)n, superlattice materials of L10 crystalline structure. The free layer 41 may be an ordered alloy including at least one of Fe, Co, Ni, Pa and Pt. For example, the free layer 41 may include at least one of Fe—Pt alloy, Fe—Pd alloy, Co—Pd alloy, Co—Pt alloy, Fe—Ni—Pt alloy, Co—Fe—Pt alloy, and Co—Ni—Pt alloy. Such alloys may be, quantochemically, Fe50Pt50, Fe50Pd50, Co50Pd50, Co50Pt50, Fe30Ni20Pt50, Co30Fe20Pt50, or Co30Ni20Pt50.

The pinned layer 43 may be an ordered alloy including at least one of Fe, Co, Ni, Pa and Pt. For example, the pinned layer 43 may include at least one of Fe—Pt alloy, Fe—Pd alloy, Co—Pd alloy, Co—Pt alloy, Fe—Ni—Pt alloy, Co—Fe—Pt alloy, and Co—Ni—Pt alloy. Such alloys may be, quantochemically, Fe50Pt50, Fe50Pd50, Co50Pd50, Co50Pt50, Fe30Ni20Pt50, Co30Fe20Pt50, or Co30Ni20Pt50.

Figure 20G:
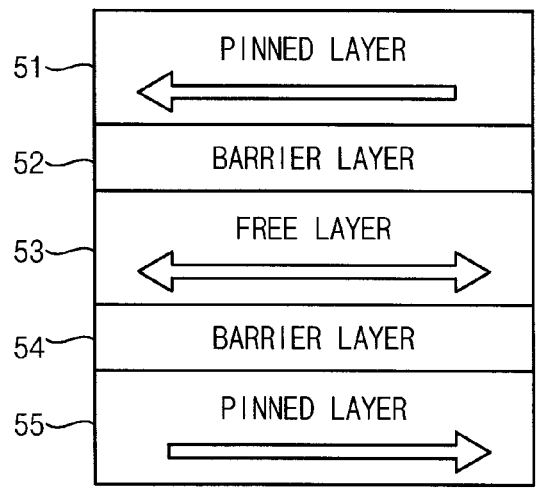
Figure 20H:
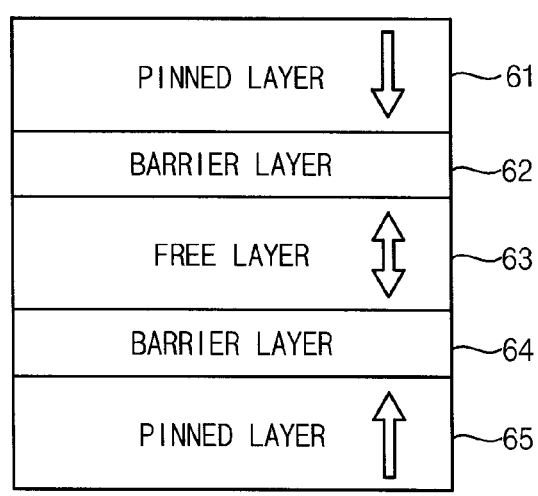

FIGS. 20G and 20H illustrate examples of a dual MTJ element having a structure that two pinned layers and two barrier layers are centered on a free layer.

Referring to FIG. 20G, a dual MTJ element 50 forming horizontal magnetization may include a first barrier layer 51, a first barrier layer 52, a free layer 53, a second barrier layer 54 and a second pinned layer 55. The materials forming the respective layers may be the same as or similar to the materials of the free layer 21, the barrier layer 22 and the pinned layer 23 in FIG. 20D.

In one example embodiment, when the magnetization direction of the first pinned layer 51 is fixed in the opposite direction to the magnetization direction of the second pinned layer 55, the magnetic fields due to the first and second pinned layers 51 and 55 may be interfered destructively. Accordingly, data may be written in the dual MTJ element 50 using the smaller write current than the single MTJ element. Also the exact data may be read from the dual MTJ element 50 because the MTJ element 50 provides the greater resistance value due to the second barrier layer 54.

Referring to FIG. 20H, a dual MTJ element 60 forming vertical magnetization may include a first barrier layer 61, a first barrier layer 62, a free layer 63, a second barrier layer 64 and a second pinned layer 65. The materials forming the respective layers may be the same as or similar to the materials of the free layer 41, the barrier layer 42 and the pinned layer 43 in FIG. 20F.

In one example embodiment, when the magnetization direction of the first pinned layer 61 is fixed in the opposite direction to the magnetization direction of the second pinned layer 65, the magnetic fields due to the first and second pinned layers 61 and 65 may be interfered destructively. Accordingly, data may be written in the dual MTJ element 60 using the smaller write current than the single MTJ element.

Figure 21A:
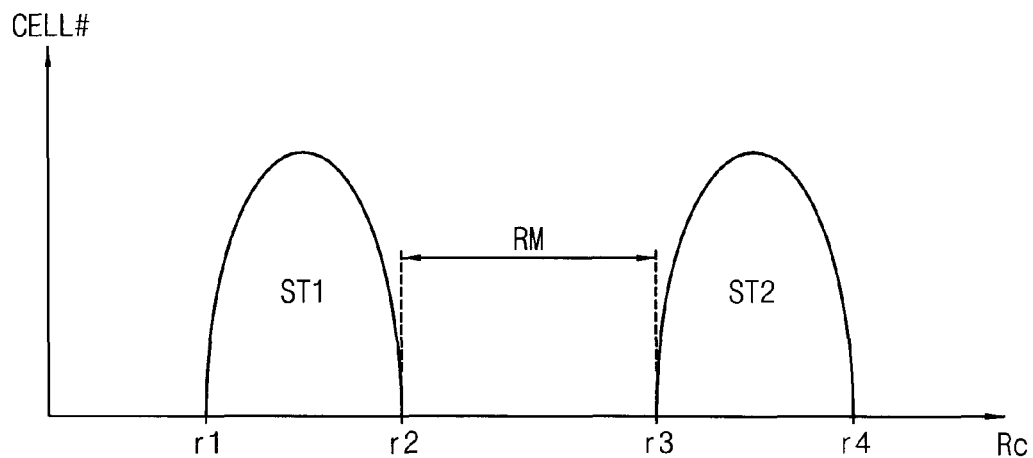
FIGS. 21A and 21B are diagrams illustrating examples of resistance distribution of resistive memory cells.
Figure 21B:
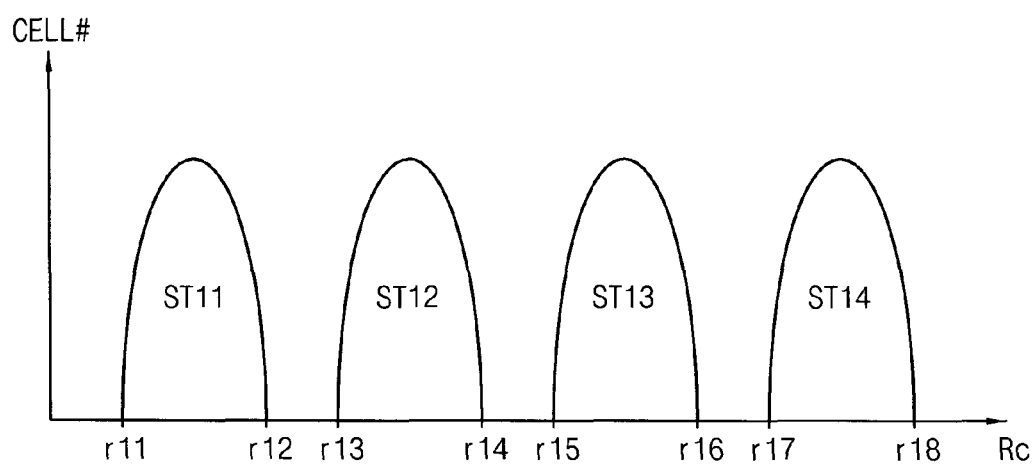

FIGS. 21A and 21B are diagrams illustrating examples of resistance distribution of resistive memory cells.

FIG. 21A illustrates an example of resistance distribution of a signal level cell (SLC) that stores one-bit data per memory cell. The resistance of the SLC may be in one of states ST1 and ST2 depending on the programmed data. The read margin RM may be increased and the performance of the resistive memory device may be enhanced as each width of the states ST1 and ST2 is decreased.

The information on the resistance distribution of the states ST1 and ST2 may be referred to determine a read voltage, a program voltage, etc. The resistances of the memory cells may be measured to distinguish the failed memory cells through tests before and/or after packaging the memory chip. The failed memory cells may be repaired or cured using the error check and correction (ECC) scheme and/or the redundant memory cells, and the incurable memory device has to be discarded. As such, the information on the resistance of the individual memory cell and the resistance distribution of the memory device may be used importantly.

FIG. 21B illustrates an example of resistance distribution of a multi-level cell (MLC) that stores, for example, two-bit data per memory cell. The resistance of the MLC may be in one of states ST11, ST12, ST13 and ST14 depending on the programmed data. Further exact measurement of the cell resistance is required for the MLC.

The on-chip resistance measurement circuit according to example embodiments may be disposed in the same semiconductor die (e.g. a semiconductor chip) as the resistive memory device and thus may measure the cell resistances efficiently and rapidly without degrading integration degree of the resistive memory device. Further the on-chip resistance measurement circuit according to example embodiments may measure the cell resistances exactly by accessing the resistive memory cells directly.

Figure 22:
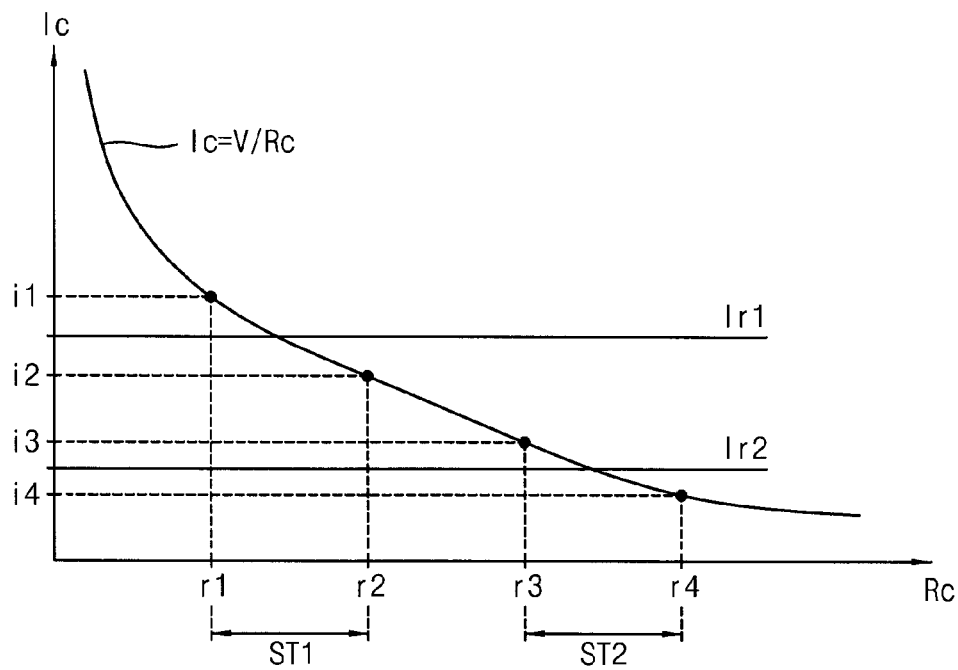
FIG. 22 is a diagram illustrating relations between a cell resistance and a cell current.

FIG. 22 is a diagram illustrating relations between a cell resistance and a cell current.

Referring to FIG. 22, the cell current Ic is inversely proportional to the cell resistance Rc according to the Ohm's law. FIG. 22 illustrates the ranges i1~i2 of the cell current Ic corresponding to the range r1~r2 of the cell resistance Rc of the first state ST1 and the ranges i3~i3 of the cell current Ic corresponding to the range r3~r3 of the cell resistance Rc of the second state ST2.

The reference currents Ir1 and Ir2 as described with reference to FIG. 8 may be determined based on the cell current ranges I1~I2 and I3~I4. In some example embodiments, one on-chip resistance measurement circuit may be used and the reference current may be varied to Ir1 or Ir2 to measure the resistance distributions for the states ST1 and ST2, respectively. In other example embodiments, the two on-chip resistance measurement circuit corresponding to the two states ST1 and ST2 may be used to measure the resistance distributions for the states ST1 and ST2, respectively.

Figure 23:
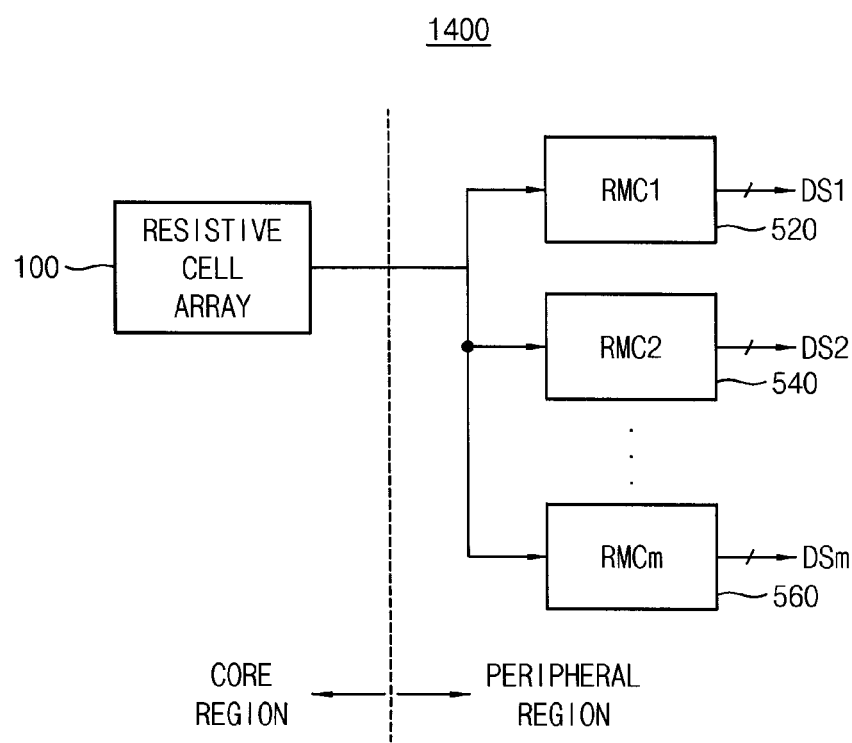
FIG. 23 is a block diagram illustrating a resistive memory device according to example embodiments.

FIG. 23 is a block diagram illustrating a resistive memory device according to example embodiments.

Referring to FIG. 23, a resistive memory device 1400 includes a resistive cell array 100 and a plurality of on-chip resistance measurement circuits RMC1, RaMC2 and RMCm 520, 540 and 560.

The resistive cell array 100 is integrated in, or disposed in, a core region of a semiconductor die (e.g., a semiconductor chip), and the resistive cell array 100 includes a plurality of resistive memory cells. The configuration of the resistive cell array 100 and the resistive memory cells are the same as described with reference to FIGS. 16 through 20H.

The on-chip resistance measurement circuits 520, 540 and 560 are disposed in a peripheral region of the semiconductor die. The on-chip resistance measurement circuits 520, 540 and 560 receive cell currents corresponding to cell resistances of selected memory cells among the resistive memory cells to generate digital signals DS1, DS2 and DSm representing the cell resistances based on the cell currents, respectively.

As described with reference to FIG. 22, the on-chip resistance measurement circuits 520, 540 and 560 may be designed to measure the cell currents of the different ranges. For example, the first on-chip resistance measurement circuit 520 may be designed to measure the cell current of the range i1~i2 corresponding to the first state ST1 and the second on-chip resistance measurement circuit 540 may be designed to measure the cell current of the range i3~i4 corresponding to the first state ST2.

In some example embodiments, the on-chip resistance measurement circuits 520, 540 and 560 may have substantially the same operation characteristics, as described with reference to FIG. 24.

Figure 24:
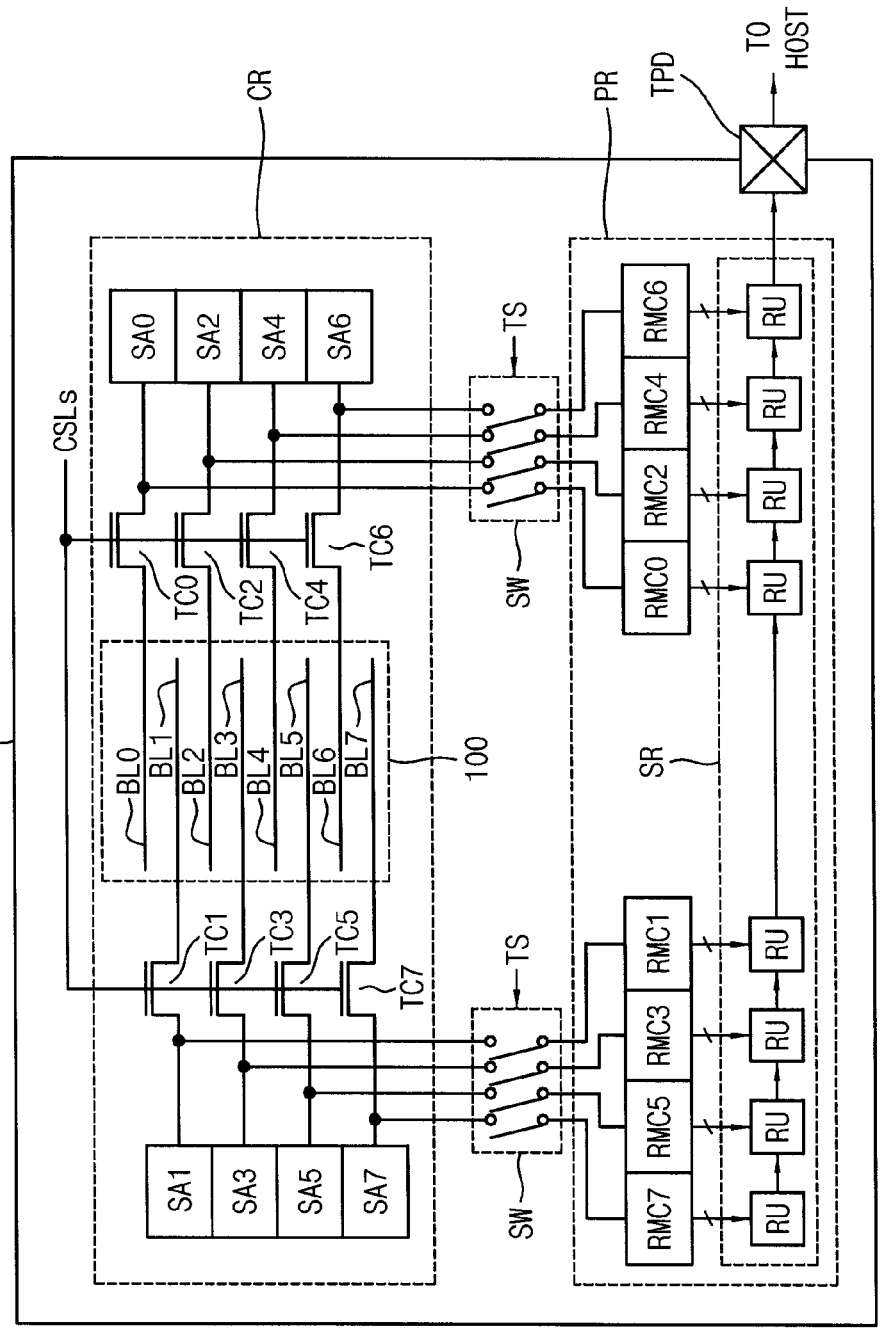
FIG. 24 is a diagram illustrating a resistive memory chip according to example embodiments.

FIG. 24 is a diagram illustrating a resistive memory chip according to example embodiments.

Referring to FIG. 24, a resistive memory chip 1600 may include a resistive cell array 100, a plurality of sense amplifiers SA0~SA7, a switch block SW, a plurality of on-chip resistance measurement circuits RMC0~RMC7 and a shift register SR. The resistive memory chip 1600 may include an on-chip resistance measurement circuit such as described herein.

The resistive cell array 100 and the sense amplifiers SA0~SA7 are disposed in the core region CR, and the on-chip resistance measurement circuits RMC0~RMC7 and the shift register SR are disposed in the peripheral region PR. The switch block SW may connect the on-chip resistance measurement circuits RMC0~RMC7 to the resistive cell array 100 in response to a test signal TS. The switch block SW may be disposed in the core region, the peripheral region or the boundary region of the core and peripheral regions.

FIG. 24 illustrates an example configuration of the resistive memory device in which the eight column selection transistors TC0~TC7 connected to the same column selection line CSLs are turned on simultaneously and the eight bitlines BL0~BL7 are selected and connected to the sense amplifiers SA0~SA7 simultaneously. The number of the bitlines selected simultaneously may be varied depending on the design of the resistive memory device. The bitlines selected simultaneously may be disposed adjacent to each other or may be disposed in the same position of the different memory blocks in the memory cell array 100, respectively.

As described above, each of the on-chip resistance measurement circuits RMC0~RMC7 may generate the different operation currents using the transistor of the different sizes, and generate the bit signals of the temperature code representing the cell resistance based on the operation currents. Each of the on-chip resistance measurement circuits RMC0~RMC7 may further include the code conversion circuit for convert the bit signals of the temperature code to the bit signals of the binary code.

The number of the on-chip resistance measurement circuits RMC0~RMC7 may be equal to the number of bit lines BL0~BL7 that are selected simultaneously in response to the same column address.

The shift register SR may include a plurality of register units RU configured to serialize the digital signals from the on-chip resistance measurement circuits RMC0~RMC7 and provide the serialized digital signals to an external device. For example, the serialized digital signals may be provided in a form of a bit stream to a host device through a test pad TPD. The host device may be a tester of a memory controller. The time for obtaining the resistance distribution may be increased as the number of the memory cells in the resistive cell array 100 is increased. The test time for obtaining the resistance distribution may be reduced and the test efficiency may be enhanced using the plurality of the on-chip resistance measurement circuits RMC0~RMC7 and the shift register SR.

Figure 25:
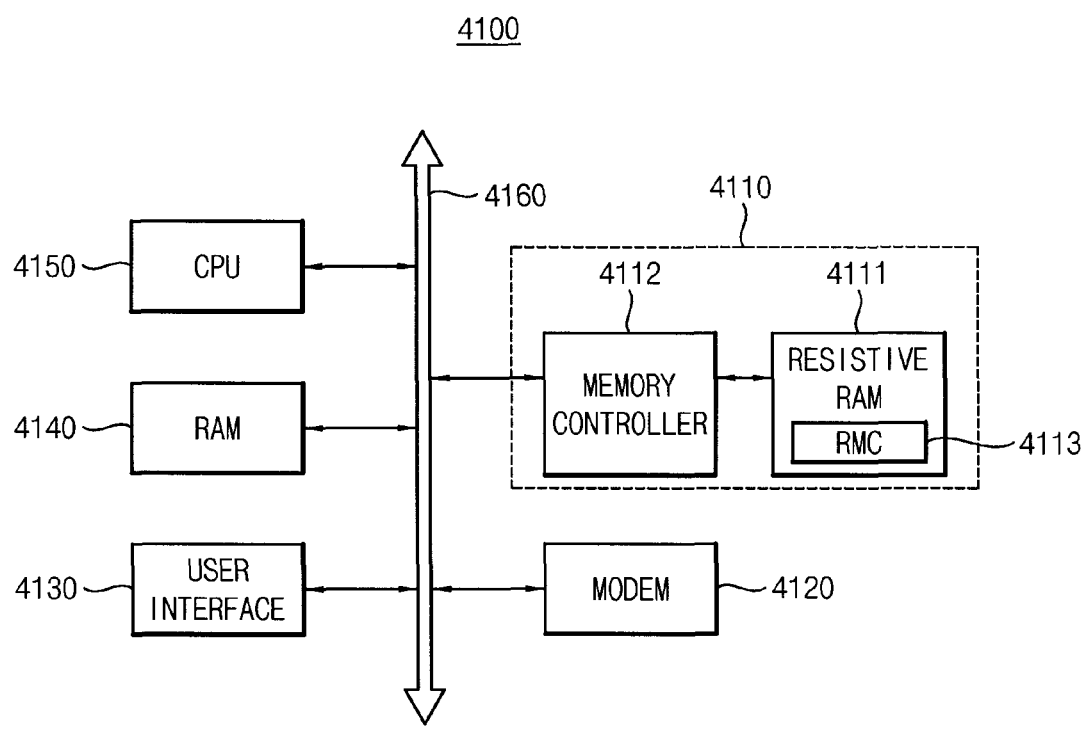
FIG. 25 is a block diagram illustrating a computing system including a resistive memory device according to example embodiments.

FIG. 25 is a block diagram illustrating a computing system including a resistive memory device according to example embodiments.

Referring to FIG. 25, a computing system 4100 may be a mobile device or a desktop computer including a resistive memory device disclosed herein. The computing system 4100 may include a memory system 4110, a modem 4120, a user interface 4130, a random access memory (RAM) 4140 and a central processing unit (CPU) 4150, which are electrically coupled to a system bus 4160.

The memory system 4110 may include a resistive memory device 4111 disclosed herein and a memory controller 4112. The resistive memory device 4111 may store data processed by the CPU 4150 and/or data provided from external devices.

At least one of the resistive memory device 4111 and the RAM 4140 may be an MRAM device including the STT-MRAM cells. The resistive memory device 4111 may include a phase-change random access memory (PRAM), a ferroelectrics random access memory (FRAM), a resistance random access memory (RRAM) and/or a magneto-resistive random access memory (MRAM), etc. Particularly the resistive memory device 4111 may be the MRAM including the STT-MRAM cell as described with reference to FIG. 19.

For example, the MRAM cells may be included in the resistive memory device 4111 for storing large amount of data and/or the RAM requiring rapid access time for system data. Even though not illustrated in FIG. 25, the computing system 4100 may further include an application chipset, an image sensor, input-output devices such as a keyboard, a monitor, etc.

The resistive memory device 4111 may include an on-chip resistance measurement circuit (RMC) 4113 such as described herein. As described above, the on-chip resistance measurement circuit 4113 is disposed in the peripheral region of the semiconductor die. The on-chip resistance measurement circuit 4113 receives the cell current corresponding to the cell resistance of the selected resistive memory cell and generates the digital signal representing the cell resistance based on the cell current.

The computing system 4100 may be implemented with various packages. For example, at least a portion of the computing system 4100 may be mounted using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP).

The above described example embodiments may be applied to an arbitrary electronic device or system that requires a resistive memory device of high capacity. For example, the example embodiments may be applied to electronic devices such as a memory card, a solid stage drive (SSD) a computer, a laptop, a digital camera, a cellular phone, a smart-phone, a smart-pad, a personal digital assistants (PDA), a portable multimedia player (PMP), an MP3 player, a navigation system, a video camcorder, a portable game console, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:
1. A resistive memory device comprising:
a resistive cell array including a plurality of resistive memory cells; and
an on-chip resistance measurement circuit configured to generate simultaneously a first current and a second current greater or less than the first current based on a cell current corresponding to a cell resistance of a selected memory cell of the resistive memory cells, and to generate first and second digital signals based on the first and second currents, respectively.

2. The resistive memory device of claim 1, wherein the on-chip resistance measurement circuit includes:
a current-to-voltage converter configured to convert the cell current to a cell bias voltage;
a first analog-to-digital converter configured to generate the first digital signal based on the first current; and
a second analog-to-digital converter configured to generate the second digital signal based on the second current,
wherein the first and second digital signals comprise a temperature code.

3. The resistive memory device of claim 2, wherein the current-to-voltage converter and the first and second analog-to-digital converters are configured to form a current mirror such that the cell bias voltage is provided to the first and second analog-to-digital converters.

4. The resistive memory device of claim 2, wherein each of the first and second analog-to-digital converters includes:
- a p-type metal oxide semiconductor (PMOS) transistor diode-coupled between a power supply voltage line and a first node;
- an n-type metal oxide semiconductor (NMOS) transistor coupled between the first node and a ground voltage line, a gate of the NMOS transistor receiving the cell bias voltage; and
- an inverter configured to generate a respective digital signal based on a voltage on the first node.

5. The resistive memory device of claim 2, wherein each of the first and second analog-to-digital converters includes:
- a p-type metal oxide semiconductor (PMOS) transistor coupled between a power supply voltage line and a first node, a gate of the PMOS transistor receiving the cell bias voltage;
- an n-type metal oxide semiconductor (NMOS) transistor diode-coupled between the first node and a ground voltage line; and
- an inverter configured to generate a respective digital signal based on a voltage on the first node.

6. The resistive memory device of claim 2, wherein each of the first and second analog-to-digital converters is configured to generate a respective operation current based on a reference bias voltage and the cell bias voltage, and to generate a respective digital signal of the temperature code based on the respective operation current.

7. The resistive memory device of claim 6, wherein each of the first and second analog-to-digital converters includes:
- a p-type metal oxide semiconductor (PMOS) transistor coupled between a power supply voltage line and a first node, a gate of the PMOS transistor configured to receive the reference bias voltage;
- an n-type metal oxide semiconductor (NMOS) transistor coupled between the first node and a ground voltage line, a gate of the NMOS transistor configured to receive the cell bias voltage; and
- an inverter configured to generate a respective digital signal based on a voltage on the first node.

8. The resistive memory device of claim 6, wherein each of the first and second analog-to-digital converters includes:
- a p-type metal oxide semiconductor (PMOS) transistor coupled between a power supply voltage line and a first node, a gate of the PMOS transistor configured to receive the cell bias voltage;
- an n-type metal oxide semiconductor (NMOS) transistor coupled between the first node and a ground voltage line, a gate of the NMOS transistor configured to receive the reference bias voltage; and
- an inverter configured to generate a respective digital signal based on a voltage on the first node.

9. The resistive memory device of claim 2, wherein the on-chip resistance measurement circuit further includes:
- a reference bias circuit configured to generate a reference bias voltage,
- wherein the first and second analog-to-digital converters are configured to generate the first and second currents based on the reference bias voltage and the cell bias voltage, and to generate the first and second digital signals of the temperature code based on the first and second currents, respectively.

10. The resistive memory device of claim 9, wherein a transistor of a first type in the current-to-voltage converter and a transistor of the first type in each of the first and second analog-to-digital converters are configured to form a current mirror such that the cell bias voltage is provided to the first and second analog-to-digital converters, and
- wherein a transistor of a second type in the reference bias circuit and a transistor of the second type in each of the first and second analog-to-digital converters are configured to form a current mirror such that the reference bias voltage is provided to the first and second analog-to-digital converters.

11. The resistive memory device of claim 9, wherein the reference bias circuit includes:
- a current source configured to generate a reference current;
- a current mirror configured to generate a mirror current based on the reference current; and
- a reference current-to-voltage converter configured to convert the mirror current to the reference bias voltage.

12. The resistive memory device of claim 11, wherein the current source is a variable current source configured to vary the reference current based on an external control signal.

13. The resistive memory device of claim 2, further comprising:
- a code conversion circuit configured to convert the temperature code to a binary code.

14. The resistive memory device of claim 1, wherein the on-chip resistance measurement circuit is coupled between a column selection circuit and a read-write circuit, the column selection circuit configured to selectively connect the read-write circuit and a bitline coupled to the selected memory cell.

15. The resistive memory device of claim 1, wherein the resistive memory device is a portion of a semiconductor chip from a wafer,
- wherein the resistive cell array is disposed in a core region of the semiconductor chip, and
- wherein the on-chip resistance measurement circuit is disposed in a peripheral region of the semiconductor chip.

16. A resistive memory device comprising:
- a resistive cell array including a plurality of resistive memory cells; and
- a plurality of on-chip resistance measurement circuits,
- wherein each of the on-chip resistance measurement circuits is configured to convert a cell current corresponding to a cell resistance of a respective memory cell of the resistive memory cells to a cell bias voltage, to generate a first current and a second current greater or less than the first current, and to generate a first digital signal and a second digital signal based on the first and second currents, respectively.

17. The resistive memory device of claim 16, further comprising:
- a shift register configured to serialize the digital signals and output the serialized digital signals.

18. The resistive memory device of claim 16, wherein a number of the on-chip resistance measurement circuits is equal to a number of bitlines that are selected simultaneously in response to a column address.

19. An on-chip resistance measurement circuit comprising:
- a current-to-voltage converter configured to convert a cell current to a cell bias voltage, the cell current corresponding to a cell resistance of a selected memory cell of a plurality of resistive memory cells; and
- an analog-to-digital converter including n conversion circuits, n being a natural number equal to or greater than 2, wherein the n conversion circuits are configured to, in response to the cell bias voltage, generate n respective operation currents different from each other and to generate n digital signals based on the n respective operation currents.

20. The on-chip resistance measurement circuit of claim 19, further comprising:
a reference bias circuit configured to generate a reference bias voltage,
wherein each of the n conversion circuits is configured to generate one of the n operation currents based on the reference bias voltage and the cell bias voltage.

* * * * *